United States Patent
Sawafta et al.

(10) Patent No.: US 11,898,802 B2
(45) Date of Patent: Feb. 13, 2024

(54) HYBRID SYSTEMS AND METHODS FOR MANAGING THERMAL ENERGY

(71) Applicant: PHASESTOR LLC, Charlotte, NC (US)

(72) Inventors: Reyad Sawafta, Asheboro, NC (US); Jason Baker, Asheboro, NC (US); Taylor Lawing, Asheboro, NC (US); Byron Owens, Asheboro, NC (US); Scott Queen, Asheboro, NC (US); Rami Saeed, Asheboro, NC (US); Manoj Raathor, Asheboro, NC (US)

(73) Assignee: PHASESTOR LLC, Asheboro, NC (US)

( * ) Notice: Subject to any disclaimer, the term of this patent is extended or adjusted under 35 U.S.C. 154(b) by 40 days.

(21) Appl. No.: 17/517,086

(22) Filed: Nov. 2, 2021

(65) Prior Publication Data

US 2022/0136782 A1 May 5, 2022

Related U.S. Application Data

(60) Provisional application No. 63/108,523, filed on Nov. 2, 2020.

(51) Int. Cl.
*F28D 20/02* (2006.01)
*F28D 20/00* (2006.01)

(52) U.S. Cl.
CPC ......... *F28D 20/021* (2013.01); *F28D 20/028* (2013.01); *F28D 2020/0008* (2013.01)

(58) Field of Classification Search
CPC ........... H05K 7/20745; H05K 7/20836; F24F 5/0021; F28D 20/02; F28D 20/028; F28D 20/021
See application file for complete search history.

(56) References Cited

U.S. PATENT DOCUMENTS

| 10,531,597 B1* | 1/2020 | Eichelberg | ............ F24F 5/0035 |
| 2020/0033069 A1* | 1/2020 | Nakamura | ........ E04F 15/02405 |

FOREIGN PATENT DOCUMENTS

WO    WO8806216 A1 *    8/1988

* cited by examiner

*Primary Examiner* — Eric S Ruppert
(74) *Attorney, Agent, or Firm* — TILLMAN WRIGHT, PLLC; Chad D. Tillman

(57) ABSTRACT

In one aspect, thermal energy storage systems are described herein. In some embodiments, such a system includes at least one active thermal storage battery and at least one passive thermal storage battery. The at least one active thermal storage battery includes a container, a heat exchanger disposed within the container, and a first phase change material disposed within the container and in thermal contact with the heat exchanger. The at least one passive thermal storage battery comprises a plurality of thermal storage cells, individual thermal storage cells comprising a container having an interior volume, and a second phase change material disposed within the interior volume of the container.

13 Claims, 10 Drawing Sheets

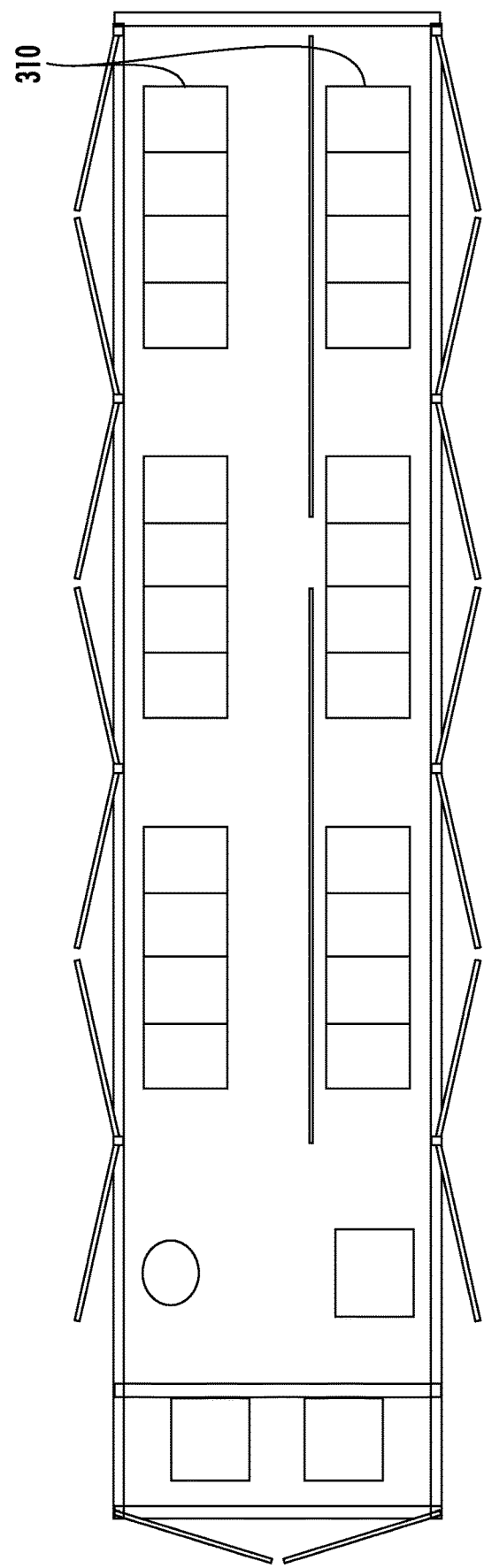

HYBRID SYSTEMS AND METHODS FOR MANAGING THERMAL ENERGY

CROSS-REFERENCE TO RELATED APPLICATIONS

This application claims priority pursuant to 35 U.S.C. § 119 to U.S. Provisional Patent Application Ser. No. 63/108,523, entitled "HYBRID SYSTEMS AND METHODS FOR MANAGING THERMAL ENERGY," filed on Nov. 2, 2020, which is hereby incorporated by reference in its entirety.

FIELD

The present disclosure relates to thermal energy storage and management systems including a phase change material (PCM) or latent heat storage material, and to methods of storing and releasing thermal energy using such systems.

BACKGROUND

The production of electricity is generally more expensive during peak demand hours than at low demand hours. Therefore, various thermal energy storage systems have been developed which permit the storage of thermal energy for later use, such as during peak demand hours. Such deferred use of stored energy can reduce strain on the power grid and/or reduce the average cost of energy per kilowatt-hour during peak load periods. However, some previous thermal energy storage systems suffer from one or more disadvantages, such as short thermal energy storage periods, low efficiency, low versatility, and difficulty of installation.

Additionally, when temperatures in a climate-controlled environment pass certain thresholds, as may occur in the event of a power outage or in extreme external temperatures, additional or supplemental thermal energy controls may be desired. However, some previous thermal energy storage systems may be limited to exclusively passive thermal energy control measures or active thermal energy control measures tied to a single temperature control point. Improved thermal energy storage systems are therefore desired.

SUMMARY

In one aspect, thermal energy storage and management systems are described herein. Such systems, in some cases, can provide one or more advantages compared to some existing systems. In some embodiments, for example, a system described herein can provide more versatile thermal energy storage and release than some existing systems. A system described herein, in some cases, can be used to actively buffer or recover a desired environmental or room temperature. Additionally, a system described herein can be used to passively buffer a desired environmental or room temperature. Moreover, a system described herein can actively buffer or recover a first desired temperature while passively buffering a second temperature.

In some embodiments, a thermal energy management system described herein comprises at least one active thermal storage battery and at least one passive thermal storage battery. The at least one active thermal storage battery comprises a container, a heat exchanger disposed within the container, and a first phase change material disposed within the container and in thermal contact with the heat exchanger. The at least one passive thermal storage battery comprises a plurality of thermal storage cells. Individual thermal storage cells comprise a container having an interior volume and a second phase change material disposed within the interior volume of the container. In some such systems described herein, the active thermal storage battery may have a charging state and/or a discharging state. While in the charging state, the active thermal storage battery maintains the first phase change material in a first phase or returns the first phase change material to the first phase. While in the discharging state, the active thermal storage battery transfers thermal energy from an environment or room external to the first phase change material to the first phase change material by changing the first phase change material to a second phase from the first phase.

As described further herein, it is also to be understood that various powered components can be connected to a thermal energy management system of the present disclosure to provide certain desirable functionality in a given configuration. For example, a chiller is attached to or associated with the active thermal storage battery to enable the first phase change material to be maintained in or returned to the first phase. Such systems may comprise one or more fans for air handling and exchange to facilitate air flow of temperature managed air and to ensure thermal communication between the active thermal storage battery and the environment or room. In certain cases, systems described herein comprise an electrical switch and/or a thermostat which may be used to initiate a charging state and/or a discharging state. Systems described herein may comprise a fluid pump operable to flow fluid through the heat exchanger in the active thermal storage battery. The powered component(s) may be powered by a traditional power grid, one or more batteries, or a hybrid system in which one or both of the power grid and the battery or batteries power the powered component(s) concurrently or sequentially, as in the case of a battery backup system.

In another aspect, methods of managing the temperature of a room are described herein. In some cases, such a method comprises disposing one or more thermal energy management systems described herein in thermal communication with the room. In such embodiments, the environment external to the phase change material is an interior of the room. Such methods may further comprise initiating the discharging state to maintain a temperature of the room or to reduce a temperature of the room by changing the first phase change material from the first phase to the second phase. Additionally, in some cases, methods described herein may comprise initiating the charging state to maintain the first phase change material in the first phase or to revert the phase change material from the second phase to the first phase. In certain cases, initiating the discharging state or the charging state may be performed in part or in whole by a thermostat or other electric switch.

These and other implementations are described in more detail in the detailed description which follows.

BRIEF DESCRIPTION OF THE DRAWINGS

FIG. 3B illustrates a top view of a room or environmental with an example of a thermal energy storage and management system.

DETAILED DESCRIPTION

Figure 1A:
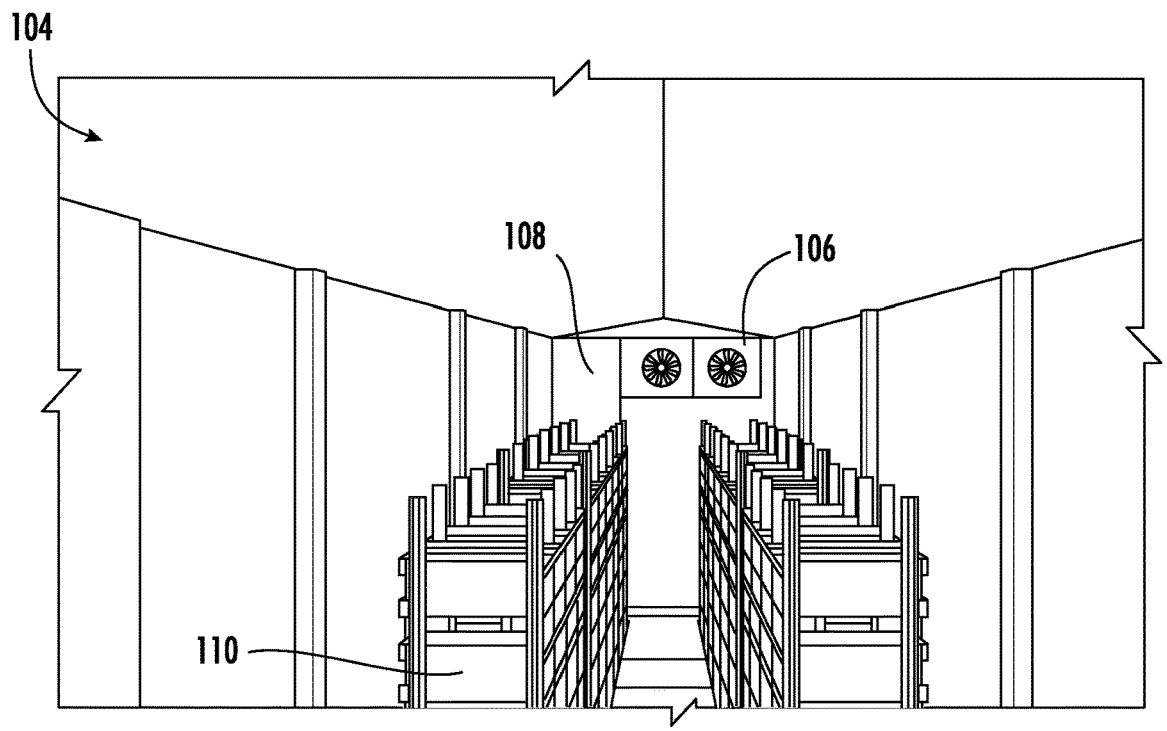
FIG. 1A illustrates a perspective view of an example of an internal view of a room of a thermal energy storage and management system.

Implementations and embodiments described herein can be understood more readily by reference to the following detailed description, examples, and drawings. Elements, apparatus, and methods described herein, however, are not limited to the specific implementations presented in the detailed description, examples, and drawings. It should be recognized that these implementations are merely illustrative of the principles of the present disclosure. Numerous modifications and adaptations will be readily apparent to those of skill in the art without departing from the spirit and scope of the disclosure.

In addition, all ranges disclosed herein are to be understood to encompass any and all subranges subsumed therein. For example, a stated range of "1.0 to 10.0" should be considered to include any and all subranges beginning with a minimum of 1.0 or more and ending with a maximum value of 10.0 or less, e.g., 1.0 to 5.3, or 4.7 to 10.0, or 3.6 to 7.9. Similarly, as will be clearly understood, a stated range of "1 to 10" should be considered to include any and all subranges beginning with a minimum of 1 or more and ending with a maximum value of 10 or less, e.g., 1 to 6, or 7 to 10, or 3.6 to 7.9.

All ranges disclosed herein are also to be considered to include the end points of the range, unless expressly stated otherwise. For example, a range of "between 5 and 10," "from 5 to 10," or "5-10" should generally be considered to include the end points of 5 and 10.

FIGS. 1-5B illustrate one or more non-limiting, exemplary implementations and embodiments of thermal energy storage systems and/or thermal energy management systems described herein. While it is to be understood that the components or features depicted in the aforementioned figures are merely representative of one implementation of these components or features, the reference numerals used in these figures correspond with the following nomenclature for such components or features in the implementations shown in the figures:

100 Thermal Energy Storage and Management System
102 External View of a Room and/or Environmental Enclosure
104 Internal View of a Room and/or Environmental Enclosure
106, 206, 406 Fan Coil
108, 208, 408 Chiller
110, 210, 310, 410 Passive Thermal Storage Battery
112, 212, 412 Active Thermal Storage Battery I. Thermal Energy Storage and Management Systems Systems described herein may be used for a variety of end-uses or applications, including, but not limited to thermal energy storage, release, cooling, and management for industrial, commercial, and/or residential buildings. Such applications may be desired, such as so-called load shifting of energy use of a heating, ventilating, and air conditioning (HVAC) system of a building, or for load shifting of other energy used by the building. In this manner, as described above, the cost of energy obtained from a power grid or from an alternative source of energy (such as a solar panel) can be reduced. Alternatively, or additionally, such applications may be desired to provide emergency or back-up heating or cooling for an environment for a limited time to supplement or temporarily replace the HVAC system of a building. Further, systems described herein can be used to reduce energy consumption of a cooling or climate-control mechanism when sensitivity to overall power draw or total energy used over a given time period in a room or environment is desired. For example, during a power outage, systems described herein can actively and/or passively buffer room temperature while minimizing total energy draw from one or more backup energy systems, such as a battery bank. Additionally, or alternatively, systems described herein can be used as a fail-safe or backup system in the event an HVAC system fails to operate normally, providing a period of time for an HVAC technician or repair team to arrive while maintaining a desired operational temperature or range within the room or environment. Thermal energy storage and management systems described herein may be used advantageously for other purposes also, as described further herein.

Figure 1B:
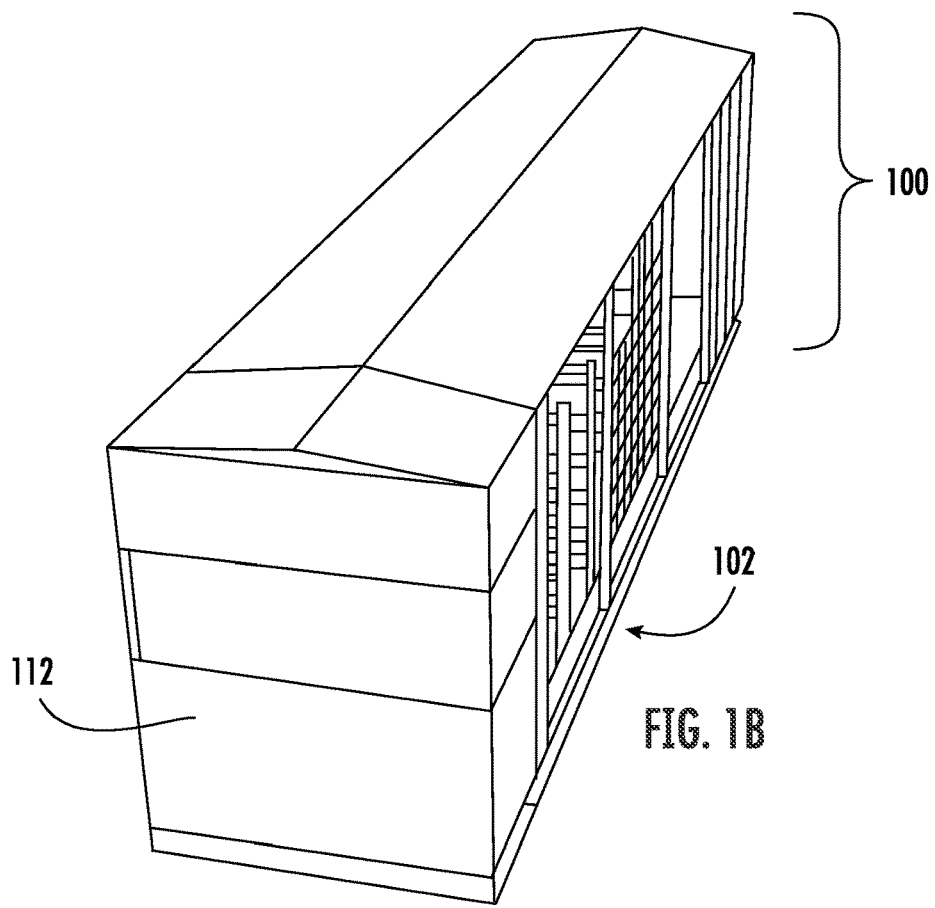
FIG. 1B illustrates a perspective view of an example of an external view of an environmental enclosure with a thermal energy storage and management system.

Referring now to FIG. 1A-B. In FIG. 1A, an illustration of a perspective view of an example of an internal view of a room 104 of a thermal energy storage and management system. In FIG. 1B, an illustration of a perspective view of an example of an external view of an environmental enclosure or room with a thermal energy storage and management system. In one aspect, thermal energy storage and/or management systems are described herein. Thermal energy management systems 100 described herein comprise at least one active thermal storage battery 112 and at least one passive thermal storage battery 110. As referenced herein, an "active" thermal storage battery 112 may have multiple modes of operation (such as a charging state and a discharging state) such that a temperature of a room or environment may be actively managed during a specific time period, as during a discharging state, and may not be managed by the active thermal storage battery 112 during other times, as during a charging state. An active thermal storage battery 112 may comprise or include additional features or components which may or may not be powered in order to further facilitate this functionality. For example, an active thermal storage battery 112 may comprise or include one or more heat exchangers and optionally one or more powered components. Any such components or features may be included consistent with the present disclosure. Certain non-limiting examples may include a fan coil 106, chiller unit 108, thermostat, electrical switch, and/or a fluid pump.

A "passive" thermal storage battery 110, as referenced herein, comprises a container having an interior volume and a phase change material disposed within the interior volume of the container, but may not include a heat exchanger to facilitate thermal energy transfer between the PCM and the environment. While a passive thermal storage battery 110 may comprise or include a fan or similar air flow management systems, such systems (not intending to be bound by theory) may provide thermal mass and/or thermal storage based solely or primarily on a phase transition temperature tied to a desired temperature or range of temperatures, rather than with the use of one or more powered components to charge/discharge the system as needed. Not intending to be bound by theory, passive thermal storage batteries 110 may rely on air flow or in-room contact with the ambient air of the room or environment to condition or otherwise thermally manage the room or environment. Passive flow of air, utilizing a passive thermal storage battery, is disclosed further in additional embodiments of FIGS. 5A-B.

Active thermal storage batteries 112 of systems described herein comprise a container. Any container not inconsistent with the objectives of the present disclosure may be used. Moreover, the container can have any size, shape, and dimensions and be formed from any material or combination of materials not inconsistent with the objectives of the present disclosure. The container is selected based upon system needs, and the dimensions are reflected based on the usage area, the amount of thermal regulation, and the goals of the room or environmental enclosure. In some embodiments, for example, the container is made from one or more weather-resistant materials, such as a polymer or synthetic rubber, thereby permitting installation of the system in an outdoor environment. In some cases, the container is metal or formed from a metal or a mixture or alloy of metals, such as aluminum. In other instances, the container is formed from plastic or a composite material, such as a composite fiber or fiberglass material.

Additionally, in some instances, the container of an active thermal storage battery 112 described herein, provides functionality beyond containment of the PCM and heat exchanger. For example, in some cases, a container comprises exterior walls, interior walls, and a thermally insulating material disposed in between the exterior walls and the interior walls. Any thermally insulating material not inconsistent with the objectives of the present disclosure may be used. In some embodiments, the thermally insulating material is air or a vacuum. In other cases, the thermally insulating material comprises a foam, such as a polyisocyanurate foam. Further, in some instances, the exterior walls and/or the interior walls of the container are formed from a metal, plastic, composite material, or a combination of two or more of the foregoing. It is further to be understood that such exterior and interior walls (as well as anything disposed between them, such as a thermally insulating material) can together form each "side wall" and "floor" of the container. Similarly, in some instances, a cover of a container described herein likewise comprises exterior walls, interior walls, and a thermally insulating material disposed in between the exterior walls and interior walls. Further, in some implementations, the "cover" is formed from such a "multi-layered" or composite cover, though the individual layers (e.g., the thermally insulating material disposed within the cover) are not expressly shown in the figures.

Moreover, in some embodiments described herein, the floor, side walls, and/or cover of the container have an R-value of at least 4 square-foot*degree Fahrenheit*hour per British thermal unit per inch (ft2*° F.*h/BTU*inch). In some cases, the floor, side walls, and/or cover of the container have an R-value of at least 5, at least 6, or at least 8 (ft2*° F.*h/BTU*inch). In some instances, the R-value of the floor, side walls, and/or cover is between 4 and 10, between 4 and 8, between 4 and 6, between 5 and 10, between 5 and 8, or between 6 and 10 (ft2*° F.*h/BTU*inch).

Additionally, in some cases, a gasket, seal, or sealing layer is disposed between the cover and the side walls of a container described herein, or is disposed within or forms part of the cover. Such a gasket may be part of the main body of the container, or part of the cover of the container. Further, such a gasket can provide further thermal insulation and/or protection of the interior volume of the container from external factors such as water or other materials that may be present in the exterior environment of the container/system, particularly when the container/system is disposed or installed outdoors. The container of a system described herein may also include or comprise lugs or other features on one or more exterior surfaces of the container, such as one or more detachable lifting lugs disposed on one or more exterior surfaces of the container.

Figure 2B:
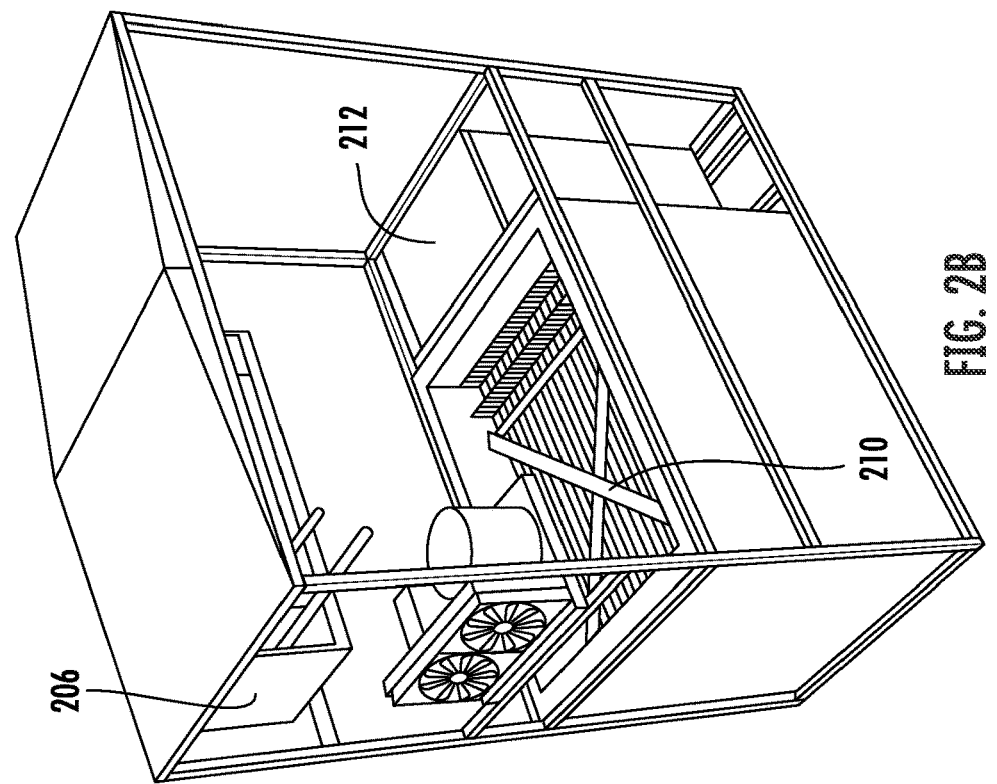
FIG. 2B illustrates an additional perspective view of an example of a module thermal energy storage and management system.
Figure 2A:
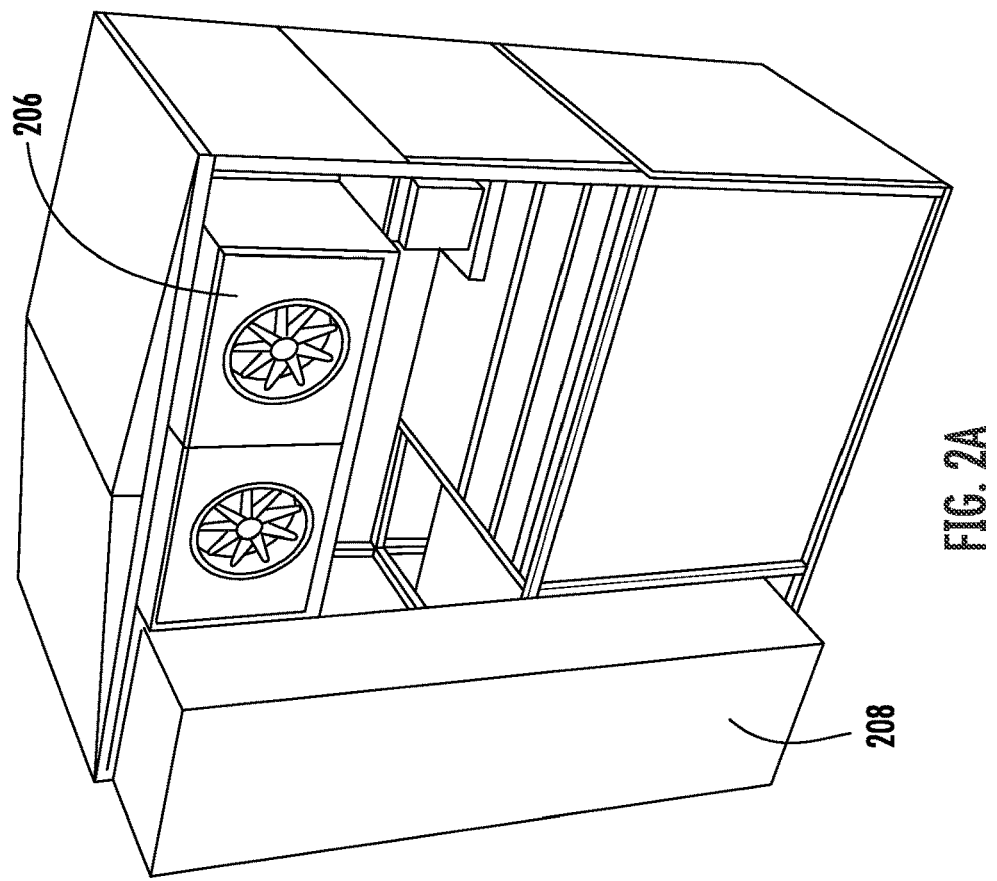
FIG. 2A illustrates a perspective view of an example of a module thermal energy storage and management system.

Referring now to FIG. 2A, an illustration of a perspective view of an example of a module thermal energy storage and management system. FIG. 2B, an illustration of an additional perspective view of an example of a module thermal energy storage and management system. In some preferred embodiments, it is particularly to be noted that the container of the active thermal storage battery 212 is not a standard shipping container. For example, in some embodiments, the container is not a container specifically approved by the Department of Transportation for shipping, such as a container having exterior dimensions of 20 feet by 8 feet by 8 feet. A container for use in an active thermal storage battery described herein, in some embodiments, can have other dimensions. The size and shape of the container, in some embodiments, are selected based on one or more of a desired thermal energy storage capacity of the system, a desired footprint of the system, and a desired stackability or portability of the system. For example, although the container is not itself a standard shipping container, it is to be understood that a container of a thermal energy management system described herein can be fitted or placed inside of a standard shipping container, such as for ease of shipment or transport of the system. In some preferred embodiments, the container of a thermal energy management system described herein has overall length, width, and height dimensions that permit two containers of two separate systems to be stacked on top of another (two high) and then placed within a standard shipping container. Further, in some cases, the overall dimensions of each container of each separate system are selected to permit an integral number (e.g., 4, 5, or 6) of "two-high" stacks to be placed or fitted within the interior of a standard shipping container. However, the exterior dimensions of the container of an active thermal storage battery described herein are not particularly limited, and other dimensions may also be used.

Active thermal storage batteries 212 described herein, further comprise at least one heat exchanger disposed within the container. Any heat exchanger may be used consistent with the objectives of the present disclosure. A heat exchanger described herein can, in some embodiments, comprise or include an inlet pipe or header, an outlet pipe or header, and a number n of thermal transfer or heat exchange plates in fluid communication with the inlet pipe and the outlet pipe such that a fluid flowing from the inlet pipe and to the outlet pipe flows through the plates in between the inlet pipe and the outlet pipe, wherein the first PCM is in thermal contact with the plates, and wherein the number n is at least 2. In some cases, the number n is at least 5, at least 10, at least 20, or at least 50. In some instance, the number n is between 2 and 500, between 2 and 250, between 2 and 100, between 5 and 500, between 5 and 100, between 10 and 200, between 10 and 100, between 10 and 40, between 20 and 200, or between 20 and 100. However, the number of plates is not particularly limited and can be chosen based on the overall dimensions of the container, the spacing between plates, the amount of PCM, and/or the desired latent heat capacity of the system. Moreover, as described above, it is to be understood that fluid generally enters the heat exchanger apparatus through a "proximal" end of the inlet pipe and generally exits the heat exchange apparatus through a "distal" end of the outlet pipe or (in some cases) through a distal end of the inlet pipe. Additionally, in some instances, a fluid flowing into the inlet pipe and out of the outlet pipe flows through at least a portion of the plates or through some of the plates after flowing into the inlet pipe but before flowing out of the outlet pipe.

Turning now to the relationship between the container of a system described herein and the heat exchanger disposed within the container, it is to be understood that the heat exchanger or heat exchange apparatus can be disposed, installed, or fitted within the container (e.g., within or primarily within the interior volume of the container) in any manner not inconsistent with the objectives of the present disclosure. For example, in some cases, the entire volume or almost the entire volume of the heat exchanger is disposed within the interior space of the container, and only a small portion or only one or more connector portions of the heat exchanger are disposed or configured outside the container for purposes of providing access to the plates or other majority portion of the heat exchanger inside the container. In some embodiments, for instance, the inlet pipe of the heat exchanger (or a connector portion thereof) passes through (or partially through) an exterior wall of the container, thereby providing fluid communication between the plates and an exterior of the container. Similarly, in some cases, the outlet pipe (or a connector portion thereof) of the heat exchanger passes through (or partially through) an exterior wall of the container, thereby providing fluid communication between the plates and an exterior of the container.

As described further herein, it is to be understood that various exterior systems can be connected to the thermal energy management system, such that fluid communication is provided between the plates of the thermal energy management system and the exterior systems. For instance, in some cases, at least one powered component such as an HVAC chiller, fluid pump, thermostat, electrical switch, and/or fan coil.

Powered components of active thermal storage batteries described herein may comprise or include a chiller, such as an HVAC chiller. The chiller unit may be operable to maintain the first PCM in a first phase or to return the first PCM to the first phase during a charging state. The chiller may be in fluid communication with the fluid in the heat exchanger to cool the fluid in order to remove thermal energy from the first PCM or, if operated in the reverse configuration, to heat the first PCM. The fluid can be any fluid not inconsistent with the objectives of the present disclosure. In some implementations, for instance, the fluid comprises a thermal fluid. For reference purposes herein, a thermal fluid can be a fluid having a high heat capacity. In some cases, a thermal fluid also exhibits high thermal conductivity. Moreover, the external fluid can be a liquid or a gas. A liquid fluid, in some embodiments, comprises a glycol, such as ethylene glycol, propylene glycol, and/or polyalkylene glycol. In some instances, a liquid fluid comprises liquid water or consists essentially of liquid water. A gaseous fluid, in some embodiments, comprises steam. The active thermal storage battery may additionally and/or alternatively comprise or include a fluid pump. The fluid pump may be operable to flow fluid through the heat exchanger in the thermal storage battery. In addition, the fluid pump may be operable to flow fluid through or past a fan coil to permit air from the room or environment to be heated or cooled and to then be redistributed to the room or environment.

An active thermal storage battery described herein may have or be adapted or configured to operate in a charging state and/or a discharging state. While in the "charging" state, the active thermal storage battery maintains the first PCM in a first phase or returns the first PCM to the first phase. For example, a first phase of the PCM may be solid, and it may be desired that the PCM is held or "charged" in the solid state until demand occurs for thermal energy transfer to store thermal energy in the PCM. Such an arrangement may be preferred where the expected demand is thermal energy storage in the PCM to cool the environment. In certain other applications, the reverse may be true, where the first PCM may be held in a first phase which is liquid, and may be held or returned to this state until there is demand for thermal energy transfer from the PCM to solidify the PCM. Such an arrangement may be desired where the anticipated need is to release thermal energy from the PCM to heat the room or environment. Either direction of energy transfer may be desired, whether the anticipated need is thermal energy storage in the PCM or release of thermal energy from the PCM.

Consistent with the above discussion of the "charging" state, while in the "discharging" state, the active thermal storage battery may transfer thermal energy from the environment external to the first PCM to the first PCM by changing the first PCM from the first phase to a second phase to cool the environment. In other applications, the discharging state may transfer thermal energy from the PCM to the environment by changing the PCM from the first phase to the second phase to heat the environment. An active thermal storage battery of systems described herein may have both the charging state and the discharging state, and may be operable to switch between the two.

In order to initiate the charging state and/or the discharging state, one or more controls may be included in the system. For example, initiating the discharging state may be achieved by a thermostat which detects that a setpoint has been met or exceeded (or, in the even that the thermal storage battery is heating the environment, that the temperature is at or below the setpoint). Additionally or alternatively, an electrical switch may be operable to permit manual input by a user to determine if the charging state or discharging state should be initiated.

Moreover, in some instances, an electrical switch may be configured to detect a power outage or a change in power source in order to initiate the charging state or the discharging state. In such embodiments, a first power source for one or more of the powered components of the system may be a traditional power grid. As referenced herein, a "traditional power grid" refers to a centralized generation of electricity which may or may not be located in the same geographic area as the load being served. In these instances, the electrical switch may be operable to detect the loss of power provided by the traditional power grid, and to initiate the discharging state to thermally manage the room or environment in thermal communication with the thermal storage battery. Additionally, or alternatively, a source of power may comprise at least one battery or a plurality of batteries. The source of power may be a lone or sole source, a primary source or a backup source of power, or may power some components while the traditional power grid powers other components. In certain implementations, the electrical switch may detect that a source or primary source of power changes from the traditional power grid to the battery or batteries (or vice versa), and may initiate the charging state or discharging state, as required.

The condition for initiating the charging state or discharging state may be tied to operational conditions of the room or environment being managed by the thermal energy management system. For example, the room or environment may have an operational minimum temperature and/or an operational maximum temperature. These temperatures maybe tied to the comfort of one or more occupants of the room or environment. Alternatively, or additionally, these temperatures may be dictated by operating or performance benchmarks of electrical or electronic equipment disposed in the room or environment. For example, an operational minimum temperature may be dictated by or tied to an expected or calculated battery capacity of one or more batteries disposed in the room or environment within a given temperature range. For example, a battery that provides 100 percent capacity at 27° C. may deliver only 50 percent of this capacity at 0° C., thus it may be desirable that a temperature is selected as an operational minimum temperature between these two values, such as between about 15° C. and 25° C. More specifically, an operational minimum temperature may be at or about 20° C. in such cases. Likewise, an operational maximum temperature may be selected to maximize capacity while controlling battery discharge rate. In such instances, an operational maximum temperature may be between 20° C. and 35° C., such as between about 25° C. and 35° C., or between about 25° C. and 30° C., and may more specifically be about 27° C.

In some embodiments, the first setpoint temperature may be greater than or equal to the operational maximum temperature, and may be higher than a phase transition temperature of the first phase change material from the first phase to the second phase. In some such embodiments, the first setpoint temperature is between 5° C. and 50° C. higher than the phase transition temperature of the first phase change material from the first phase to the second phase, such as between 5° C. and 45° C. higher, between 5° C. and 40° C. higher, between 5° C. and 35° C. higher, between 5° C. and 30° C. higher, between 10° C. and 40° C. higher, between 15° C. and 40° C. higher, between 20° C. and 40° C. higher, or between 10° C. and 30° C. higher, such as between 20° C. and 30° C. higher than the phase transition temperature. Alternatively, the first setpoint temperature can be lower than the phase transition temperature of the first setpoint temperature. In some such embodiments, the first setpoint temperature is between 5° C. and 50° C. lower than the phase transition temperature of the first phase change material from the first phase to the second phase, such as between 5° C. and 45° C. lower, between 5° C. and 40° C. lower, between 5° C. and 35° C. lower, between 5° C. and 30° C. lower, between 10° C. and 40° C. lower, between 15° C. and 40° C. lower, between 20° C. and 40° C. lower, or between 10° C. and 30° C. lower, such as between 20° C. and 30° C. lower than the phase transition temperature of the first PCM.

In certain embodiments of systems described herein, it may be desired that an overall power draw of the one or more powered components is less than a total latent heat of the first PCM, in particular over an operational time frame of the discharging state. Reduced power draw or power utilization during the discharging state relative to a traditional HVAC system, for example, may be desired where the thermal energy management systems described herein are being operated primarily or entirely by one or more batteries. In such embodiments, this reduced power draw may permit the battery or batteries to more effectively power other components external to the thermal energy management system. Additionally and/or alternatively, such an arrangement may permit a longer cycle time of the discharging state or more cycles between the charging state and discharging state. For example, in some embodiments, the power draw of the one or more powered components, in total, may be less than a latent heat of the first PCM over a period of up to 8 hours, such as over a period of 1-4 hours, 1-5 hours, 1-6 hours, 2-5 hours, or 3-5 hours. For instance, in some embodiments, a total power draw of the powered component(s) may be less than a latent heat of the first PCM over a period of 1 hour, 2 hours, 3 hours, 4 hours, or 5 hours.

Figure 3A:
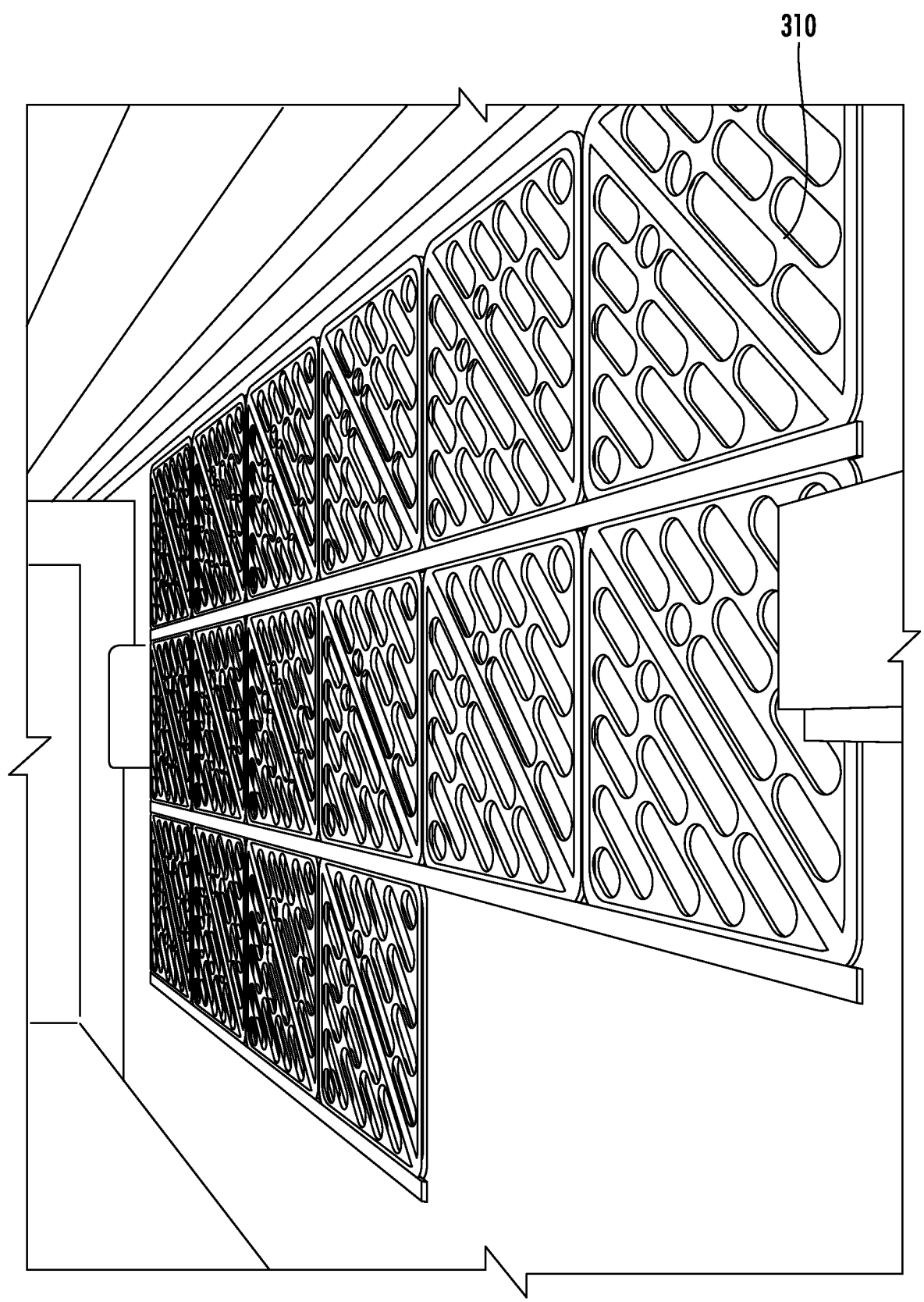
FIG. 3A illustrates a perspective view of an example embodiment of a passive thermal storage battery.

Referring now to FIG. 3A-B. FIG. 3A illustrates a perspective view of an example embodiment of a passive thermal storage battery. FIG. 3B illustrates a top view of a room or environmental with an example of a thermal energy storage and management system. Thermal energy management systems described herein further comprise at least one passive thermal storage battery 310. Passive thermal storage batteries 310 of systems described herein comprise a plurality of thermal storage cells (See FIG. 4D), with individual thermal storage cells comprising or including a container having an interior volume and a second phase change material disposed within the interior volume of the container. Containers of thermal storage cells described herein comprise an exterior surface defining an interior or internal volume. A container used in a thermal storage cell of a passive thermal storage battery described herein can have any shape or arrangement consistent with the present disclosure. For example, in some embodiments, the container has the form or shape of a plate, blade, grid, or panel. The plate, blade, grate, grid, or panel (referred to collectively as a "container" below, for convenience) can be generally square or rectangular in cross section (e.g., such that the container is a relatively short or "flat" rectangular cylinder). Additionally, the container may include a fill spout. The fill spout (when in in an open configuration, as opposed to a closed or sealed configuration) provides fluid communication between the interior volume and the external environment of the container. The exterior surface of the container includes a front side, a back side, and at least four corners. The fill spout is disposed at one of the corners of the exterior surface.

Further, in some preferred embodiments, a container of a thermal storage cell of a passive thermal storage battery 310 described herein also comprises a cap. More particularly, such a cap can cover, enclose, or "complete" the corner where the fill spout is disposed. Thus, in some cases, for instance, surfaces of the cap align with the exterior surface of the container to conceal the corner fill spout.

For example, in some embodiments, the container can be generally square or rectangular in cross section (e.g., such that the container is a relatively short or "flat" rectangular cylinder). Moreover, in certain preferred embodiments, the container has a relatively high surface area to volume ratio. For example, in some cases, the container can have a surface area to volume ratio (e.g., in units of cm²/cm³) of at least 1:2, at least 1:3, at least 1:4, at least 1:5, at least 1:10, at least 1:20, at least 1:50, or at least 1:100. In some embodiments, the container has a surface area to volume ratio between about 1:3 and 1:100, between about 1:3 and 1:50, between about 1:5 and 1:100, between about 1:5 and 1:50, or between about 1:10 and about 1:100. Similarly, in some cases, the average thickness of the container can be relatively small compared to the average length and average width of the container. For instance, in some embodiments, the average length and the average width of the container are at least 5 times, at least 10 times, at least 20 times, or at least 50 times the average thickness of the container. In some cases, the average length and the average width of the container are 5-100, 5-50, 5-20, 10-100, or 10-50 times the average thickness of the container.

Moreover, in some preferred implementations, the exterior surface of the container further comprises one or more protrusions. The protrusions extend in an orthogonal or substantially orthogonal (e.g., within 15 degrees, within 10 degrees, or within 5 degrees of orthogonal) direction from the back side of the container. As further described herein, in some cases, the one or more protrusions are configured or operable to form a gap between the back side of the container and an adjacent surface, such as a wall against which the container is disposed or another container with which the container is stacked. The protrusions can thus act as a spacer.

In addition, in some especially preferred embodiments, the exterior surface of the container further comprises one or more channels extending from the front side to the back side and connecting the front side to the back side. These channels may also be described as through holes or perforations of the container.

In some cases, at least 90% of the interior volume of a container is occupied by the PCM (which may be referred to below as a "thermal management material"). In other cases, at least 95%, at least 96%, at least 97%, at least 98%, or at least 99% of the interior volume is occupied by the thermal management material. In other embodiments, the thermal management material occupies 50-100%, 60-100%, 70-100%, 80-100%, 90-100%, 90-99%, 90-98%, 95-100%, or 95-98% of the interior volume of the container.

The exterior surface of container of a thermal storage cell of a passive thermal storage battery 310, in some embodiments, is operable to facilitate heat transfer between an external environment and the interior volume, or between the external environment and a PCM disposed within the interior volume. For example, in some embodiments, the exterior surface can comprise or be formed from one or more materials that facilitate heat transfer, such as a thermal exchange material or a thermally conductive material. Any material operable to permit thermal exchange from the container to the external environment can be used. Thermally conductive materials which may form one or more materials of the container described herein have a thermal conductivity greater than or equal to a thermal conductivity of the PCM disposed within the interior volume of the container(s). Specifically, in some embodiments, the thermally conductive material has a thermal conductivity higher than a thermal conductivity of the PCM within the interior volume of the container. Thermally conductive materials which may form one or more materials of the container described herein may have a thermal conductivity of at least 0.2 W/m*K. For example, in some embodiments, thermally conductive materials have a thermal conductivity of at least 0.4 W/m*K, such as at least 0.5 W/m*K, at least 0.75 W/m*K, or at least W/m*K. In some instances, a thermally conductive material has a thermal conductivity of between 0.2 and 450 W/m*K, such as between 0.4 W/m*K and 450 W/m*K, 0.2 and 400 W/m*K, 0.2 and 350 W/m*K, 0.2 and 300 W/m*K, 0.2 and 250 W/m*K, 0.2 and 200 W/m*K, 0.2 and 150 W/m*K, or 0.2 and 100 W/m*K. In some instances, the thermally conductive material has a thermal conductivity of between 0.2 and 90 W/m*K, 0.2 and 75 W/m*K, 0.2 and 50 W/m*K, and 0.2 and 25 W/m*K. In certain other implementations, the thermally conductive material has a thermal conductivity of between 0.4 and 400 W/m*K, 0.4 and 350 W/m*K, 0.4 and 300 W/m*K, 0.4 and 250 W/m*K, 0.4 and 200 W/m*K, 0.4 and 150 W/m*K, or 0.4 and 100 W/m*K. In yet further embodiments, the thermally conductive material has a thermal conductivity of between 0.4 and 90 W/m*K, 0.4 and 75 W/m*K, 0.4 and 50 W/m*K, and 0.4 and 25 W/m*K. In still further embodiments, the thermally conductive material has a thermal conductivity of at least 7 W/m*K, such as between 7 and 450 W/m*K. Additionally, in some instances, a thermal conductivity of the container is at least one order of magnitude higher than a thermal conductivity of the PCM, such as at least two orders of magnitude higher, or at least three orders of magnitude higher. Not intending to be bound by theory, a container being formed from one or more materials which has a thermal conductivity one or more orders of magnitude higher than the PCM within the container may facilitate heat absorption and/or dissipation, thereby reducing "charging" time of the thermal storage cell and increasing the buffer time of the thermal storage battery while being "discharged."

Some non-limiting examples of materials usable for containers of thermal storage cells of passive thermal storage batteries described herein include a polymeric or plastic material (such as a polyethylene, polypropylene, polyethylene terephthalate, polyvinyl chloride, polycarbonate, polyoxymethylene, acrylonitrile butadiene styrene, or polyether ether ketone), a metal or mixture or alloy of metals (such as aluminum), and a composite material (such as a composite fiber or fiberglass). It is to be understood that the material forming or used to form the exterior surface of the container, in some preferred embodiments, can generally form or define the entire body of the container or substantially the entire body of the container. Additionally, the material used to form the exterior surface (or the entire body or substantially the entire body of the container) can be non-breathable or non-permeable to water, and/or non-flammable or fire-resistant. Moreover, in some instances, the material used to form the exterior surface (or the entire body or substantially the entire body of the container) is non-electrically conductive, or has low or minimal electrical conductivity, such that the material is considered an electrical insulator rather than an electrical conductor. The use of a non-electrically conductive material to form the exterior surface of a container described herein may be especially desirable, for example, if the container is placed in a room or space in which sensitive and/or expensive electronic devices are used, such as a telecommunications data room or data center in which computer systems and associated components are housed.

Further, in some cases, a thermally conductive material described above can be dispersed within a non-thermally conductive material or within a less thermally conductive material. In some embodiments, for example, a thermally conductive material comprises a paint, ink, or pigment, or a metal dispersed in a paint, ink, or pigment. Moreover, the paint, ink, or pigment can be used to form a design or decorative feature on the exterior surface of the container.

Additionally, the material forming the exterior surface (or the entire body or substantially the entire body of the container) can have any thickness not inconsistent with the objectives of the present disclosure. In some embodiments, the thickness is selected based on a desired mechanical strength and/or thermal conductivity. For example, in some cases, the average thickness of the material forming the exterior surface (or the entire body or substantially the entire body of the container) is less than 10 mm, less than 5 mm, less than 3 mm, or less than 1 mm. In some embodiments, the average thickness is between 1 and 10 mm, between 1 and 5 mm, between 1 and 3 mm, between 3 mm and 10 mm, between 3 mm and 5 mm, or between 5 mm and 10 mm.

Moreover, in some embodiments, the exterior surface of the container can have one or more features, such as edges that are flat, rounded, bullnose, or beveled connecting the front and back sides of the exterior surface. Other features of a container can include one or more recessed regions, protrusions, and/or channels. In some cases, one or more features present on the front side of the container are also present on the back side of the container. In other instances, the front side can include one or more features absent from the back side of the container, or vice versa.

In some embodiments, the exterior surface can further comprise one or more channels, through-holes, or perforations. As described above, one or more channels present in a container can increase the surface area of the container or air flow "through" the container (from the front side to the back side). The presence, number, and size of channels can also be selected based on a desired thermal storage capacity of the container (e.g., as determined by a volume or mass of PCM disposed within the interior volume of the container, where a larger total channel volume corresponds to a smaller total volume of PCM, for a given size container). The channels can have any shape not inconsistent with the objectives of the present disclosure. For example, in some cases, a channel has a shape (e.g., a sectional shape when viewed from the front or the back side of the container) that is generally circular, oval, or oblong. The shape can also be a polygonal shape having sharp or rounded corners. Further, in some embodiments, the channels (or the "sidewalls" of the channels) can have straight, rounded, beveled, or bullnose edges connecting the front and back sides of the exterior surface.

Additionally, in some example embodiments, a container described herein further comprises a fill spout having an opening in fluid communication with the interior volume of the container and an external environment of the container. In some cases, the fill spout is generally cylindrical in shape. However, other shapes may also be used. The fill spout, in some embodiments, is disposed at one of the corners of the exterior surface. In some embodiments, the fill spout further comprises an air outlet. The air outlet is operable to allow displaced air to exit the internal volume while filling the thermal management container via the fill spout.

Containers described herein can be formed from any material not inconsistent with the objectives of the present disclosure. For example, in some embodiments, containers described herein comprise or are formed from a material which is operable to facilitate heat transfer between an external environment and the interior volume, or between the external environment and a PCM disposed within the interior volume. For example, in some embodiments, the container's exterior surface can comprise or be formed from one or more materials that facilitate heat transfer, such as a thermal exchange material or a thermally conductive material. Any material operable to permit thermal exchange from the container to the external environment can be used. Some non-limiting examples of materials suitable for use in forming a container described herein include a polymeric or plastic material (such as a polyethylene, a polypropylene, polyethylene terephthalate, polyvinyl chloride, polycarbonate, polyoxymethylene, acrylonitrile butadiene styrene, or a polyether ether ketone), a metal or mixture or alloy of metals (such as aluminum), and a composite material (such as a composite fiber or fiberglass). It is to be understood that the material forming or used to form the container or the exterior surface of the container, in some preferred embodiments, can generally form or define the entire body of the container or substantially the entire body of the container.

In some alternative embodiments, the container may be formed as an elongated structure such as a bar, tube, or other elongated prism structure having an internal volume which may be filled or partially filled with a PCM. In such implementations, the container has a first end and a second end spaced apart from the first end, the separate ends defining a length. The container in such embodiments also defines a width. The container may have a large length to width ratio. For example, in some embodiments, the ratio of the length to the width is at least 5:1, such as at least 10:1, at least 15:1, or at least 20:1. Additionally, a ratio of the length to the width may be even larger, such as at least 25:1, at least 30:1, or as large as at least 50:1, or at least 100:1. In some embodiments, the container has a length to width ratio between 5:1 and 100:1, between 5:1 and 50:1, between 5:1 and 25:1, between 5:1 and 20:1, between 5:1 and 15:1, or between 5:1 and 10:1. In some cases, the length to width ratio may fall between 10:1 and 100:1, such as between 10:1 and 50:1, between 10:1 and 25:1, between 10:1 and 20:1, or between 10:1 and 15:1. Other ratios are also possible, such as between 15:1 and 100:1, between 15:1 and 50:1, between 15:1 and 25:1, or between 15:1 and 20:1. Additionally, a ratio of the length to the width may be between 20:1 and 100:1, such as between 20:1 and 50:1, or 25:1 and 50:1. Moreover, a ratio of the length to the width may be between 25:1 and 100:1, such as between 50:1 and 100:1, or between 25:1 and 50:1.

Thermal storage cells of the passive thermal storage battery or batteries described herein have a second phase change material disposed within the interior volume of the container. A phase transition temperature of the second PCM may be selected based on the first setpoint associated with the active thermal storage battery, or may be selected to correspond to a second, different temperature or range of temperatures. In instances where the second PCM's phase transition temperature differs from or otherwise does not correspond to the first setpoint temperature, the phase transition temperature may define or correspond to a second setpoint temperature. The second setpoint temperature can have any desired relationship with the operational minimum and operational maximum temperatures not inconsistent with the objectives of the present disclosure. For example, the second PCM (and correspondingly, the passive thermal storage battery) may be configured to thermally manage the room or environment at or to a temperature within the operational range, defined as being greater or higher than the operational minimum temperature, but lower than or less than the operational maximum temperature. The phase transition temperature of the second PCM may be selected to function as desired with this second setpoint, although the phase transition temperature of the second PCM may be the same or substantially the same as the second setpoint, the phase transition temperature may also differ from the setpoint. Such configurations can be used to reduce normal HVAC function within the range to reduce energy consumption.

Alternatively, the second setpoint can be tied to different temperature and/or performance parameters from the first setpoint. For example, while the first setpoint may be selected for an upper bound or operational maximum temperature control, a second setpoint may be selected for a lower bound or operational minimum temperature control. Thus, the second setpoint may be equal to or lower than the operational minimum temperature. Alternatively, the second setpoint may be higher than the operational minimum temperature to reduce the likelihood of the operational minimum temperature being reached, or to reduce the temperature change as it approaches the operational minimum temperature. For example, the second setpoint (or, independent of the second setpoint, the phase transition temperature of the second PCM) may be within 2-5° C. greater or higher than the operational minimum temperature, or may be within 2-5° C. less than the operational minimum temperature. The second setpoint may alternatively be equal to or higher than the operational maximum temperature, or within a few degrees above or below the operational maximum temperature. Therefore, the second setpoint (or, independent of the second setpoint, the phase transition temperature of the second PCM) may be within 2° C. and 5° C. greater than the operational maximum temperature, or within 2° C. and 5° C. less than the operational maximum temperature.

The phase transition temperature of the second PCM can be selected independently from and may be distinctly different from the phase transition temperature of the first PCM. For example, in some embodiments, the phase transition temperature of the second PCM may be at least 10° C. higher than the phase transition temperature of the first PCM, such as between 10° C. and 40° C. higher, between 15° C. and 30° C. higher, between 15° C. and 30° C. higher, or between 20° C. and 30° C. higher than a phase transition temperature of the first PCM.

Any phase change material ("PCM") or combination of PCMs not inconsistent with the objectives of the present disclosure may be used in a component or method described herein, in particular as the first PCM or second PCM of systems or methods described herein. The first and/or second PCMs maybe selected individually or may be selected to have coordinating or cooperating phase transition temperatures. Moreover, the PCM (or combination of PCMs) used in a particular instance can be selected based on a relevant operational temperature range for the specific end use or application. For example, in some cases, the PCM has a phase transition temperature within a range suitable for cooling or helping to maintain a desired temperature or set point in a residential or commercial building or portion thereof. As understood by one having ordinary skill in the art, a phase transition temperature described herein (such as a phase transition temperature of "X" ° C., where X may be 23° C., for example) may be represented as a normal distribution of temperatures centered on X° C. In addition, as understood by one having ordinary skill in the art, a PCM described herein can exhibit thermal hysteresis, such that the PCM exhibits a phase change temperature difference between the "forward" phase change and the "reverse" phase change (e.g., a solidification temperature that is different from the melting temperature). In some such instances, the building or portion thereof is a data center or data room, or an attic. In other embodiments, the building or portion thereof is a refrigerated room, warehouse, or other space, or is a freezer. In other instances, the PCM has a phase transition temperature suitable for the thermal energy management of so-called waste heat. In some embodiments, the PCM has a phase transition temperature within one of the ranges of Table 1 below.

TABLE 1

Phase transition temperature ranges for PCMs (at a pressure of 1 atm).
Phase Transition Temperature Ranges

| |
|---|
| 16-23° C. |
| 16-18° C. |
| 20-28° C. |
| 15-20° C. |
| 8-15° C. |
| 6-8° C. |
| 0-6° C. |
| −10° C. to 0° C. |
| −40° C. to −10° C. |

Moreover, in certain embodiments, it may be desirable or even preferable that a phase transition temperature of the PCM or mixture of PCMs is at or near a desired set-point temperature in an interior of a room or an external environment. Any desired room temperature or external temperature and associated phase transition temperature can be used. For example, in some embodiments, a phase transition temperature is between about 15° C. and about 32° C. at 1 atm, such as between about 17° C. and about 30° C. at 1 atm, between about 19° C. and about 28° C., or between about 21° C. and about 26° C. at 1 atm. Further, in some cases, a phase transition temperature is between about 17° C. and about 32° C. at 1 atm, such as between about 19° C. and about 32° C. at 1 atm, between about 21° C. and about 32° C. at 1 atm, between about 23° C. and about 32° C. at 1 atm, or between about 25° C. and about 32° C. at 1 atm. Moreover, in some embodiments, a phase transition temperature is between about 15° C. and about 30° C. at 1 atm, such as between about 15° C. and about 28° C. at 1 atm, between about 15° C. and about 26° C. at 1 atm, or between about 15° C. and about 24° C. at 1 atm.

As described further herein, a particular range can be selected based on the desired application. For example, PCMs having a phase transition temperature of 20-25° C. can be especially desirable to assist in the cooling of data centers, while PCMs having a phase transition temperature of 6-8° C. can be especially desirable for maintaining the temperature of a refrigerated space. As another non-limiting example, PCMs having a phase transition between −40° C. and −10° C. can be preferred for use in commercial freezer cooling.

Additionally, it may be desirable or even preferable that a phase transition temperature of the PCM or mixture of PCMs is separate from a desired setpoint temperature of an interior of a room or an environment. Not intending to be bound by theory, such an arrangement could be placed in thermal communication with the room or environment when on-demand heating or cooling of the room or environment is desired by providing a larger difference between the ambient temperature of the room or environment and the phase transition temperature of the PCM. In such embodiments, it may be desirable for the phase transition temperature to be at least 5° C. greater or lesser than a temperature or setpoint temperature of the room or environment, such as between 5° and 35° C. greater or lesser, between 10° and 35° C. greater or lesser, between 15° and 35° C. greater or lesser, between 20° and 35° C. greater or lesser, between 5° and 30° C. greater or lesser, between 5° and 25° C. greater or lesser, between 5° and 20° C. greater or lesser, or between 5° and 15° C. greater or lesser than the ambient temperature or the setpoint temperature of the room or environment. Such embodiments may be desired where a fan or fan coil is used in tandem with the phase change material to exhaust or otherwise disperse air that is warmer or cooler than the setpoint temperature or ambient room temperature by an amount the same or substantially the same as the phase transition temperature. Thus, in such cases, the exhausted air may be at least 5° C., at least 10° C., at least 15° C., or at least 20° C. warmer or cooler than the ambient temperature of the air in the environment or room, such as such as between 5° and 35° C. greater or lesser, between 10° and 35° C. greater or lesser, between 15° and 35° C. greater or lesser, between 20° and 35° C. greater or lesser, between 5° and 30° C. greater or lesser, between 5° and 25° C. greater or lesser, between 5° and 20° C. greater or lesser, or between 5° and 15° C. greater or lesser than the ambient temperature or the setpoint temperature of the room or environment.

Further, a PCM of a device or method described herein can either absorb or release energy using any phase transition not inconsistent with the objectives of the present disclosure. For example, the phase transition of a PCM described herein, in some embodiments, comprises a transition between a solid phase and a liquid phase of the PCM, or between a solid phase and a mesophase of the PCM. A mesophase, in some cases, is a gel phase. Thus, in some instances, a PCM undergoes a solid-to-gel transition. A solid to solid transition is also possible.

Moreover, in some cases, a PCM or mixture of PCMs has a phase transition enthalpy of at least about 50 kJ/kg or at least about 100 kJ/kg. In other embodiments, a PCM or mixture of PCMs has a phase transition enthalpy of at least about 150 kJ/kg, at least about 200 kJ/kg, at least about 300 kJ/kg, or at least about 350 kJ/kg. In some instances, a PCM or mixture of PCMs has a phase transition enthalpy between about 50 kJ/kg and about 350 kJ/kg, between about 100 kJ/kg and about 350 kJ/kg, between about 100 kJ/kg and about 220 kJ/kg, or between about 100 kJ/kg and about 250 kJ/kg.

In addition, a PCM of a device or method described herein can have any composition not inconsistent with the objectives of the present disclosure. In some embodiments, for instance, a PCM comprises an inorganic composition. In other cases, a PCM comprises an organic composition. In some instances, a PCM comprises a salt hydrate. Suitable salt hydrates include, without limitation, $CaCl_2 \cdot 6H_2O$, $Ca(NO_3)_2 \cdot 3H_2O$, $NaSO_4 \cdot 10H_2O$, $Na(NO_3)_2 \cdot 6H_2O$, $Zn(NO_3)_2 \cdot 2H_2O$, $FeCl_3 \cdot 2H_2O$, $Co(NO_3)_2 \cdot 6H_2O$, $Ni(NO_3)_2 \cdot 6H_2O$, $MnCl_2 \cdot 4H_2O$, $CH_3COONa \cdot 3H_2O$, $LiC_2H_3O_2 \cdot 2H_2O$, $MgCl_2 \cdot 4H_2O$, $NaOH \cdot H_2O$, $Cd(NO_3)_2 \cdot 4H_2O$, $Cd(NO_3)_2 \cdot 1H_2O$, $Fe(NO_3)_2 \cdot 6H_2O$, $NaAl(SO_4)_2 \cdot 12H_2O$, $FeSO_4 \cdot 7H_2O$, $Na_3PO_4 \cdot 12H_2O$, $Na_2B_4O_7 \cdot 10H_2O$, $Na_3PO_4 \cdot 12H_2O$, $LiCH_3COO \cdot 2H_2O$, and/or mixtures thereof. The PCM may also be water. In other embodiments, the PCM is not water.

In other embodiments, a PCM comprises a fatty acid. A fatty acid, in some embodiments, can have a C4 to C28 aliphatic hydrocarbon tail. Further, in some embodiments, the hydrocarbon tail is saturated. Alternatively, in other embodiments, the hydrocarbon tail is unsaturated. In some embodiments, the hydrocarbon tail can be branched or linear. Non-limiting examples of fatty acids suitable for use in some embodiments described herein include caprylic acid, capric acid, lauric acid, myristic acid, palmitic acid, stearic acid, arachidic acid, behenic acid, lignoceric acid, and cerotic acid. In some embodiments, a PCM described herein comprises a combination, mixture, or plurality of differing fatty acids. For reference purposes herein, it is to be understood that a chemical species described as a "Cn" species (e.g., a "C4" species or a "C28" species) is a species of the identified type that includes exactly "n" carbon atoms. Thus, a C4 to C28 aliphatic hydrocarbon tail refers to a hydrocarbon tail that includes between 4 and 28 carbon atoms.

In some embodiments, a PCM comprises an alkyl ester of a fatty acid. Any alkyl ester not inconsistent with the objectives of the present disclosure may be used. For instance, in some embodiments, an alkyl ester comprises a methyl ester, ethyl ester, isopropyl ester, butyl ester, or hexyl ester of a fatty acid described herein. In other embodiments, an alkyl ester comprises a C2 to C6 ester alkyl backbone or a C6 to C12 ester alkyl backbone. In some embodiments, an alkyl ester comprises a C12 to C28 ester alkyl backbone. Further, in some embodiments, a PCM comprises a combination, mixture, or plurality of differing alkyl esters of fatty acids. Non-limiting examples of alkyl esters of fatty acids suitable for use in some embodiments described herein include methyl laurate, methyl myristate, methyl palmitate, methyl stearate, methyl palmitoleate, methyl oleate, methyl linoleate, methyl docosahexanoate, methyl ecosapentanoate, ethyl laurate, ethyl myristate, ethyl palmitate, ethyl stearate, ethyl palmitoleate, ethyl oleate, ethyl linoleate, ethyl docosahexanoate, ethyl ecosapentanoate, isopropyl laurate, isopropyl myristate, isopropyl palmitate, isopropyl stearate, isopropyl palmitoleate, isopropyl oleate, isopropyl linoleate, isopropyl docosahexanoate, isopropyl ecosapentanoate, butyl laurate, butyl myristate, butyl palmitate, butyl stearate, butyl palmitoleate, butyl oleate, butyl linoleate, butyl docosahexanoate, butyl ecosapentanoate, hexyl laurate, hexyl myristate, hexyl palmitate, hexyl stearate, hexyl palmitoleate, hexyl oleate, hexyl linoleate, hexyl docosahexanoate, and hexyl ecosapentanoate.

In some embodiments, a PCM comprises a fatty alcohol. Any fatty alcohol not inconsistent with the objectives of the present disclosure may be used. For instance, a fatty alcohol, in some embodiments, can have a C4 to C28 aliphatic hydrocarbon tail. Further, in some embodiments, the hydrocarbon tail is saturated. Alternatively, in other embodiments, the hydrocarbon tail is unsaturated. The hydrocarbon tail can also be branched or linear. Non-limiting examples of fatty alcohols suitable for use in some embodiments described herein include capryl alcohol, pelargonic alcohol, capric alcohol, undecyl alcohol, lauryl alcohol, tridecyl alcohol, myristyl alcohol, pentadecyl alcohol, cetyl alcohol, heptadecyl alcohol, stearyl alcohol, nonadecyl alcohol, arachidyl alcohol, heneicosyl alcohol, behenyl alcohol, lignoceryl alcohol, ceryl alcohol, and montanyl alcohol. In some embodiments, a PCM comprises a combination, mixture, or plurality of differing fatty alcohols.

In some embodiments, a PCM comprises a fatty carbonate ester, sulfonate, or phosphonate. Any fatty carbonate ester, sulfonate, or phosphonate not inconsistent with the objectives of the present disclosure may be used. In some embodiments, a PCM comprises a C4 to C28 alkyl carbonate ester, sulfonate, or phosphonate. In some embodiments, a PCM comprises a C4 to C28 alkenyl carbonate ester, sulfonate, or phosphonate. In some embodiments, a PCM comprises a combination, mixture, or plurality of differing fatty carbonate esters, sulfonates, or phosphonates. In addition, a fatty carbonate ester described herein can have two alkyl or alkenyl groups described herein or only one alkyl or alkenyl group described herein.

Moreover, in some embodiments, a PCM comprises a paraffin. Any paraffin not inconsistent with the objectives of the present disclosure may be used. In some embodiments, a PCM comprises n-dodecane, n-tridecane, n-tetradecane, n-pentadecane, n-hexadecane, n-heptadecane, n-octadecane, n-nonadecane, n-eicosane, n-heneicosane, n-docosane, n-tricosane, n-tetracosane, n-pentacosane, n-hexacosane, n-heptacosane, n-octacosane, n-nonacosane, n-triacontane, n-hentriacontane, n-dotriacontane, n-tritriacontane, and/or mixtures thereof.

In addition, in some embodiments, a PCM comprises a polymeric material. Any polymeric material not inconsistent with the objectives of the present disclosure may be used. Non-limiting examples of suitable polymeric materials for use in some embodiments described herein include thermoplastic polymers (e.g., poly(vinyl ethyl ether), poly(vinyl n-butyl ether) and polychloroprene), polyethylene glycols (e.g., CARBOWAX® polyethylene glycol 400, CARBOWAX® polyethylene glycol 600, CARBOWAX® polyethylene glycol 1000, CARBOWAX® polyethylene glycol 1500, CARBOWAX® polyethylene glycol 4600, CARBOWAX® polyethylene glycol 8000, and CARBOWAX® polyethylene glycol 14,000), and polyolefins (e.g., lightly crosslinked polyethylene and/or high density polyethylene).

Additional non-limiting examples of phase change materials suitable for use in some embodiments described herein include BioPCM materials commercially available from Phase Change Energy Solutions (Asheboro, North Carolina), such as BioPCM-(-8), BioPCM-(-6), BioPCM-(-4), BioPCM-(-2), BioPCM-4, BioPCM-6, BioPCM 08, BioPCM-Q12, BioPCM-Q15, BioPCM-Q18, BioPCM-Q20, BioPCM-Q21, BioPCM-Q23, BioPCM-Q25, BioPCM-Q27, BioPCM-Q30, BioPCM-Q32, BioPCM-Q35, BioPCM-Q37, BioPCM-Q42, BioPCM-Q49, BioPCM-55, BioPCM-60, BioPCM-62, BioPCM-65, BioPCM-69, and others.

It is further to be understood that a device described herein can comprise a plurality of differing PCMs, including differing PCMs of differing types. Any mixture or combination of differing PCMs not inconsistent with the objectives of the present disclosure may be used. In some embodiments, for example, a thermal management plate or panel comprises one or more fatty acids and one or more fatty alcohols. Further, as described above, a plurality of differing PCMs, in some cases, is selected based on a desired phase transition temperature and/or latent heat of the mixture of PCMs.

Further, in some embodiments, one or more properties of a PCM described herein can be modified by the inclusion of one or more additives. Such an additive described herein can be mixed with a PCM and/or disposed in a device described herein. In some embodiments, an additive comprises a thermal conductivity modulator. A thermal conductivity modulator, in some embodiments, increases the thermal conductivity of the PCM. In some embodiments, a thermal conductivity modulator comprises carbon, including graphitic carbon. In some embodiments, a thermal conductivity modulator comprises carbon black and/or carbon nanoparticles. Carbon nanoparticles, in some embodiments, comprise carbon nanotubes and/or fullerenes. In some embodiments, a thermal conductivity modulator comprises a graphitic matrix structure. In other embodiments, a thermal conductivity modulator comprises an ionic liquid. In some embodiments, a thermal conductivity modulator comprises a metal, including a pure metal or a combination, mixture, or alloy of metals. Any metal not inconsistent with the objectives of the present disclosure may be used. In some embodiments, a metal comprises a transition metal, such as silver or copper. In some embodiments, a metal comprises an element from Group 13 or Group 14 of the periodic table. In some embodiments, a metal comprises aluminum. In some embodiments, a thermal conductivity modulator comprises a metallic filler dispersed within a matrix formed by the PCM. In some embodiments, a thermal conductivity modulator comprises a metal matrix structure or cage-like structure, a metal tube, a metal plate, and/or metal shavings. Further, in some embodiments, a thermal conductivity modulator comprises a metal oxide. Any metal oxide not inconsistent with the objectives of the present disclosure may be used. In some embodiments, a metal oxide comprises a transition metal oxide. In some embodiments, a metal oxide comprises alumina.

In other embodiments, an additive comprises a nucleating agent. A nucleating agent, in some embodiments, can help avoid subcooling, particularly for PCMs comprising finely distributed phases, such as fatty alcohols, paraffinic alcohols, amines, and paraffins. Any nucleating agent not inconsistent with the objectives of the present disclosure may be used. In still other instances, an additive comprises a fire retardant or fire-resistant material.

II. Methods of Storing and Releasing Thermal Energy

Figure 4A:
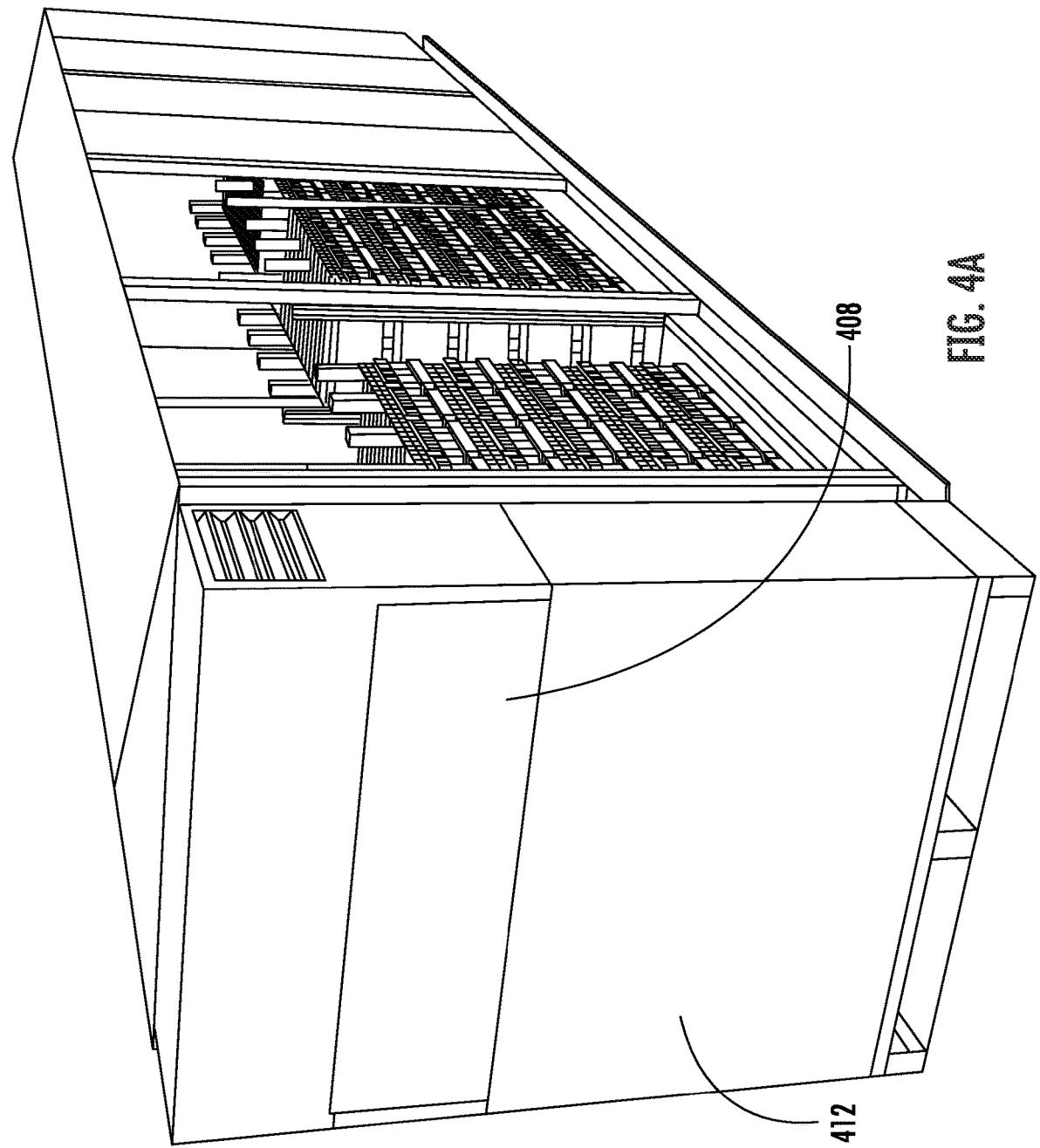
FIG. 4A illustrates a perspective view of an additional example of an external view of an environmental enclosure with a thermal energy storage and management system.
Figure 4B:
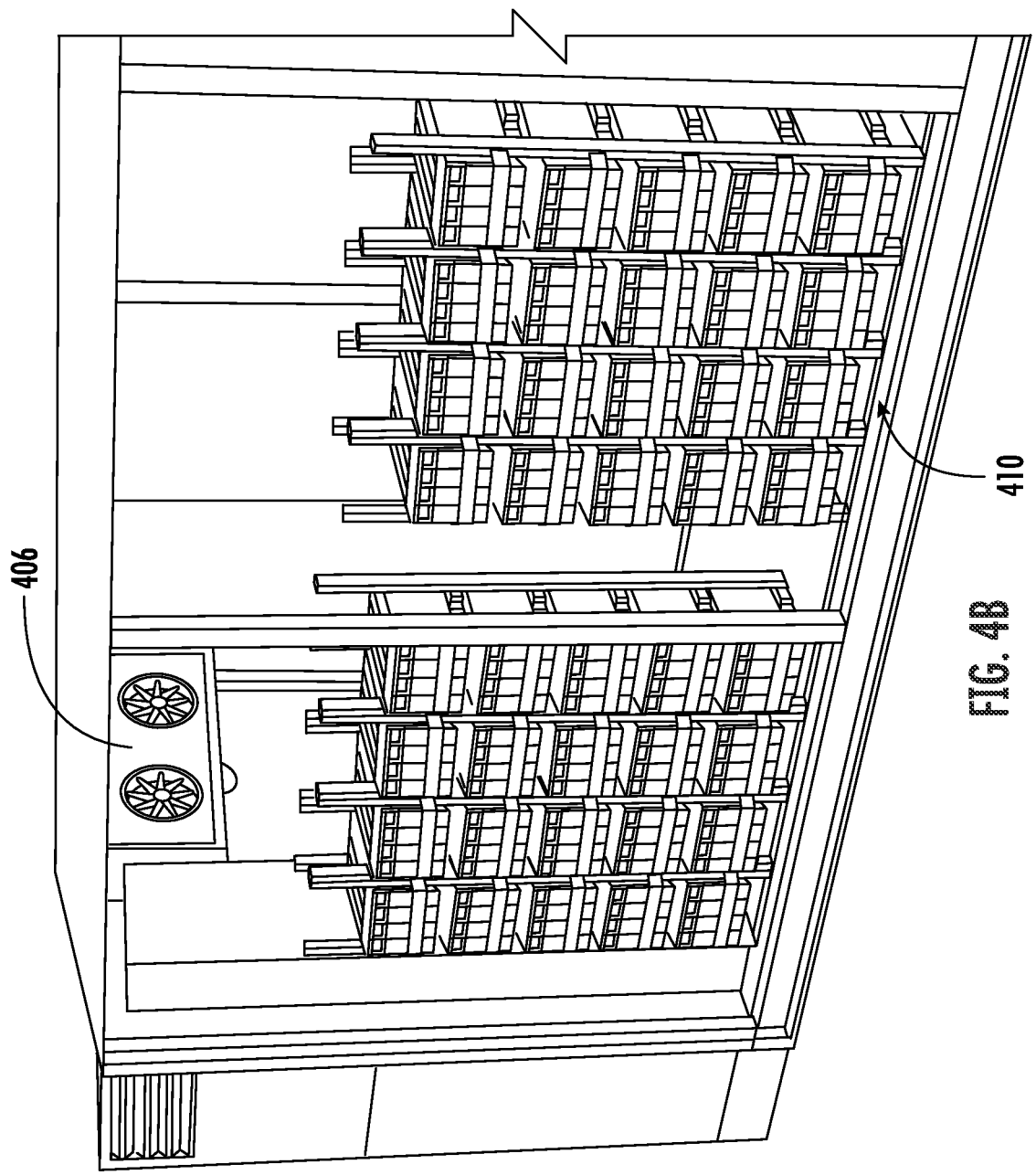
FIG. 4B illustrates a perspective view of an additional example of a thermal energy storage and management system.
Figure 4C:
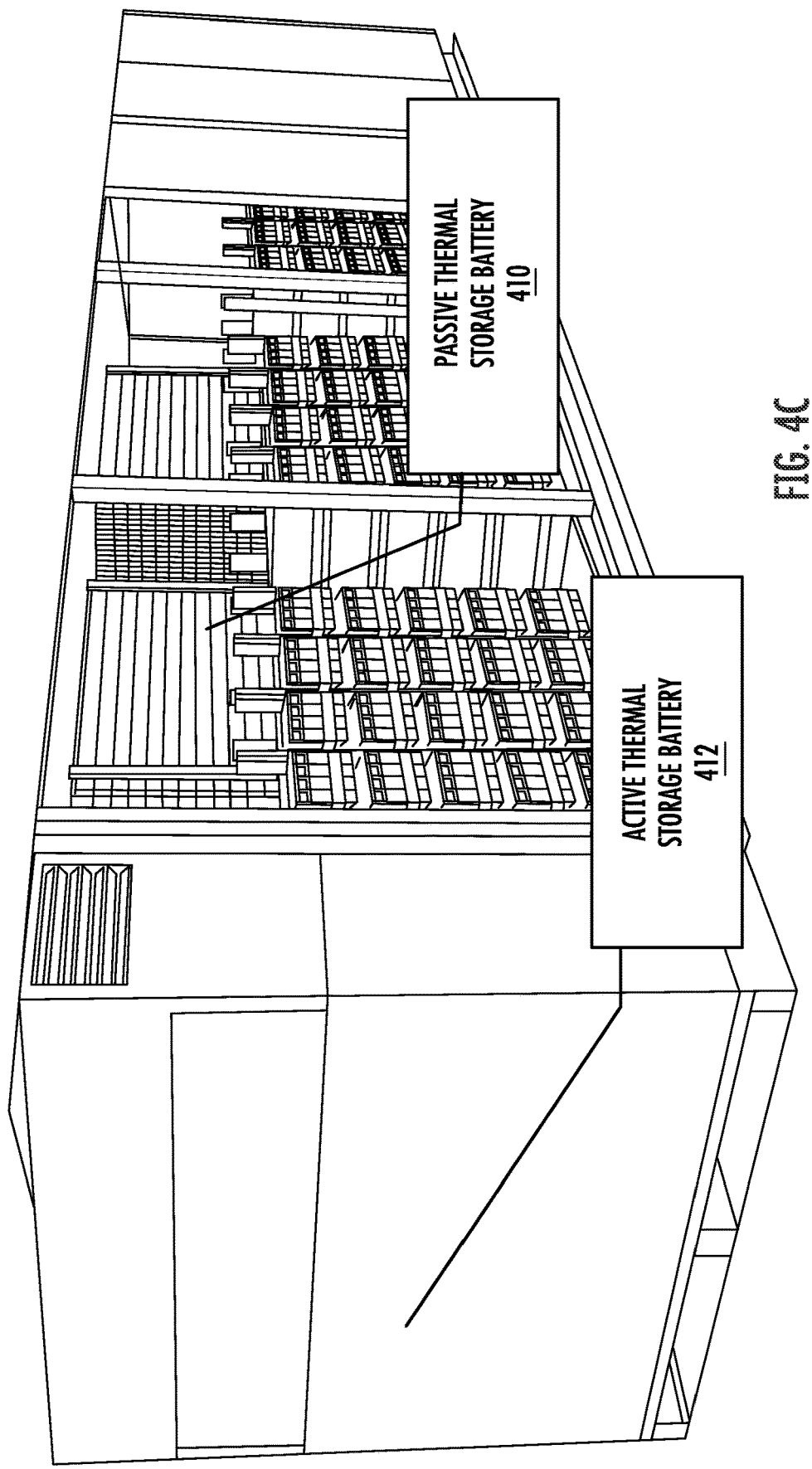
FIG. 4C illustrates a perspective view of an additional example of a thermal energy storage and management system.
Figure 4D:
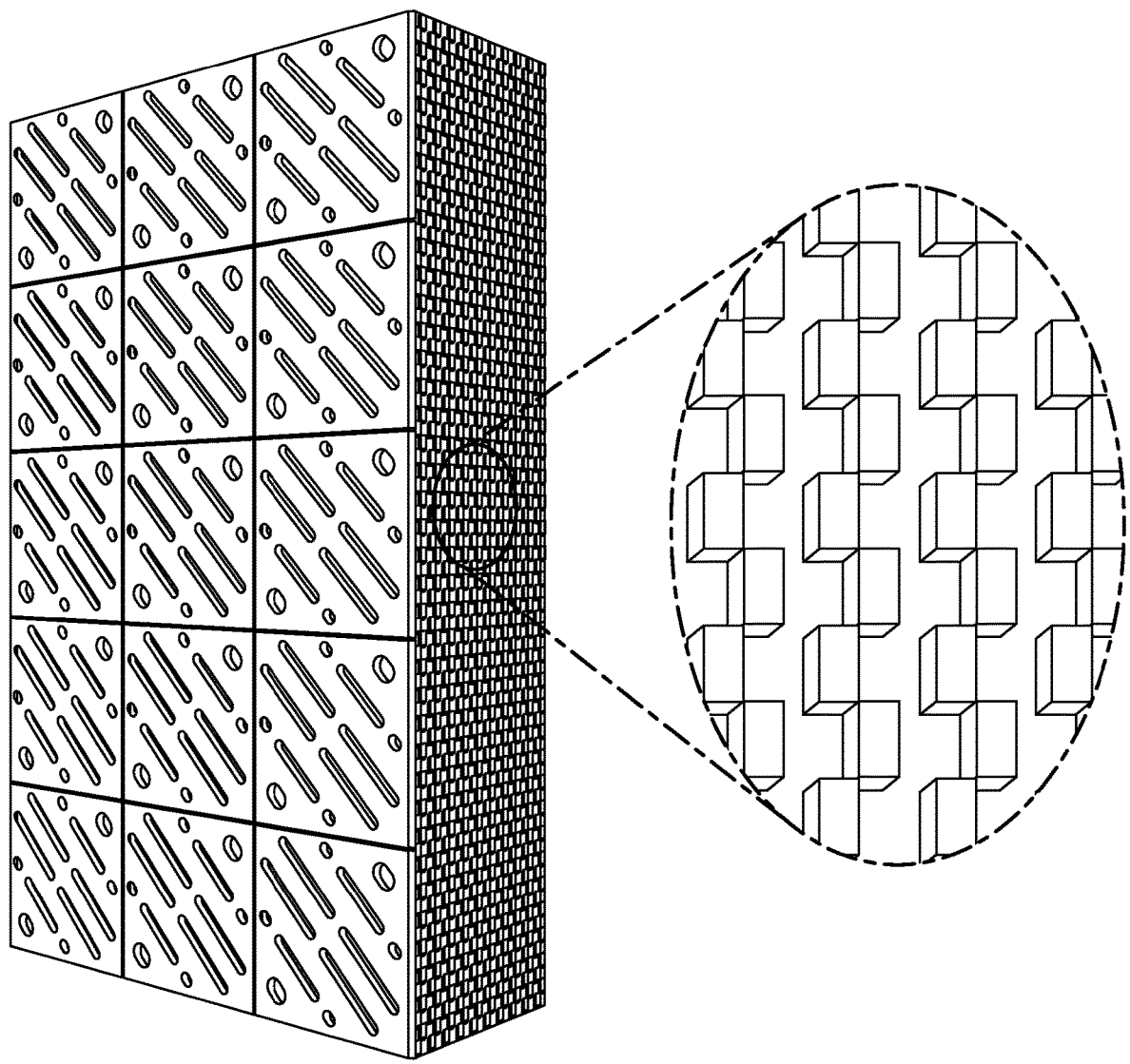
FIG. 4D illustrates the structure of an example embodiment of a passive thermal storage battery.

Referring now to FIGS. 4A-D. FIG. 4A illustrates a perspective view of an additional example of an external view of an environmental enclosure with a thermal energy storage and management system. FIG. 4B illustrates a perspective view of an additional example of a thermal energy storage and management system. FIG. 4C illustrates a perspective view of an additional example of a thermal energy storage and management system. FIG. 4D illustrates the structure of an example embodiment of a passive thermal storage battery. In one aspect, methods of storing and releasing or otherwise managing thermal energy are described herein. In some implementations, the method comprises disposing one or more of the systems of Section I in thermal communication with a room or environment. In FIG. 4A the room is container, wherein the active thermal storage battery 412 resides as a module exterior to the main room, and wherein the passive thermal storage battery 410 is internal to the room. The active thermal storage battery comprises 412 additional components such as a chiller 408, and a fan coil 406, that allows for operation.

In one aspect, any method or configuration for placing the system in thermal communication with the room or environment may be used. In some embodiments, the active thermal storage battery may be disposed external to the room or environment, but may be placed in thermal communication with the room or environment by one or more ducts, or may be in thermal communication at a fan coil or other air handling device. Further, in some implementations, the passive thermal storage battery may be disposed internal to the room or environment, being in thermal communication by direct contact with ambient air in the room or environment.

Methods described herein may further comprise initiating the discharging state to maintain a temperature of the room by changing the first phase change material from the first phase to the second phase. Initiating the discharging state may be performed by the thermostat described in Section I, by a separate electrical switch which may or may not be in addition to or in tandem with (and therefore instead of or in addition to) the thermostat. The electrical switch may be adapted to detect a power source or change in power source. The electrical switch is, in some implementations, adapted to detect a power outage and/or a return of power. A discharging mode may be selected or initiated by the thermostat or electrical switch based on any individual condition or combination of conditions as selected by the user.

Methods described herein may additionally comprise or include initiating a charging state of the first phase change material to maintain the first phase change material in the first phase or to revert the phase change material from the second phase to the first phase. Such initiation may be performed by any configuration or component described above in connection to the initiation of the discharging state, and may be tied to alternative or opposite conditions of the charging state. For example, if a discharging state is initiated at or above the first setpoint temperature, the charging state may be initiated at a point below the first setpoint temperature. Alternatively, if a discharging state is initiated when a power source is detected to change from the traditional power grid to one or more batteries, the charging state may be initiated when the power source is detected to change from the one or more batteries to the traditional power grid. Moreover, in some embodiments, the charging state may be initiated with a complete or near-complete phase transition from the first phase to the second phase is detected in order to "recharge" or otherwise revert the first phase change material to the first phase for further use in a discharging state at a later point.

Figure 5A:
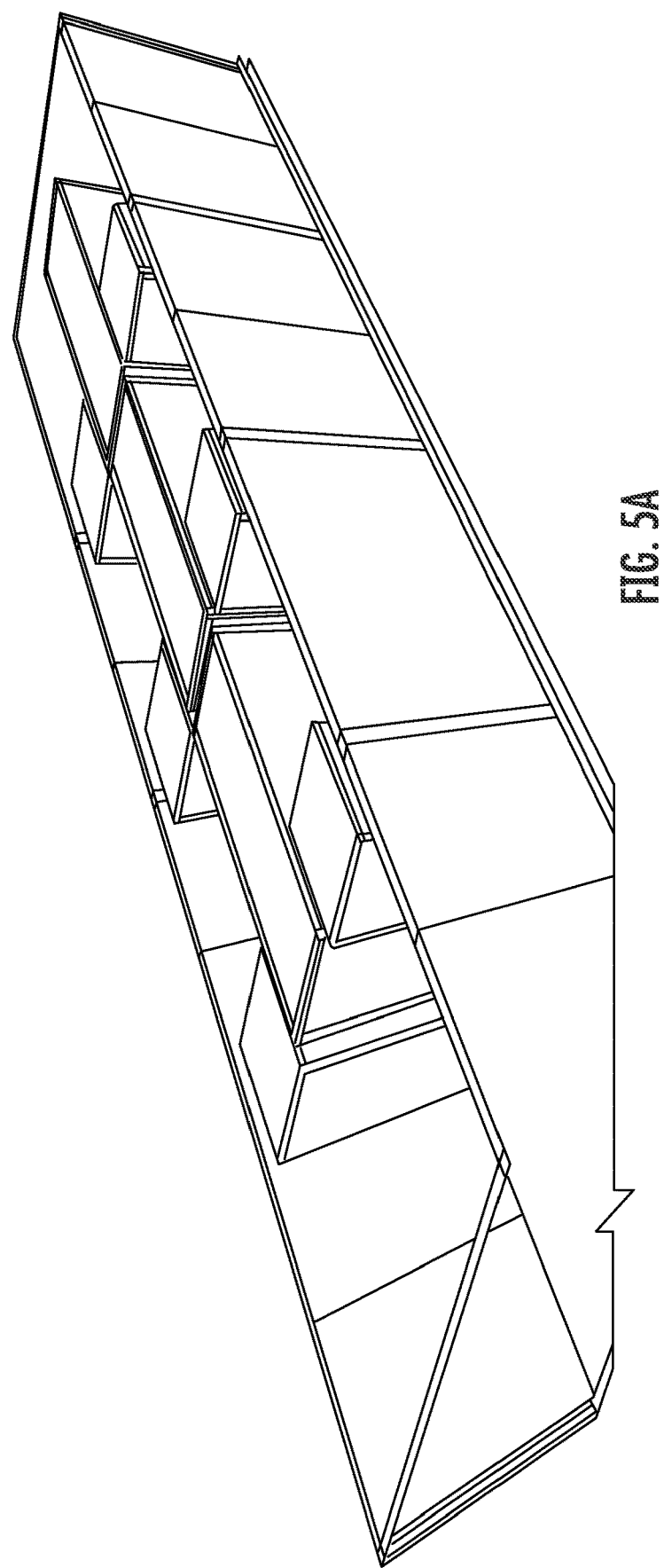
FIG. 5A illustrates an example of a layout or room for use with a thermal energy storage and management system.
Figure 5B:
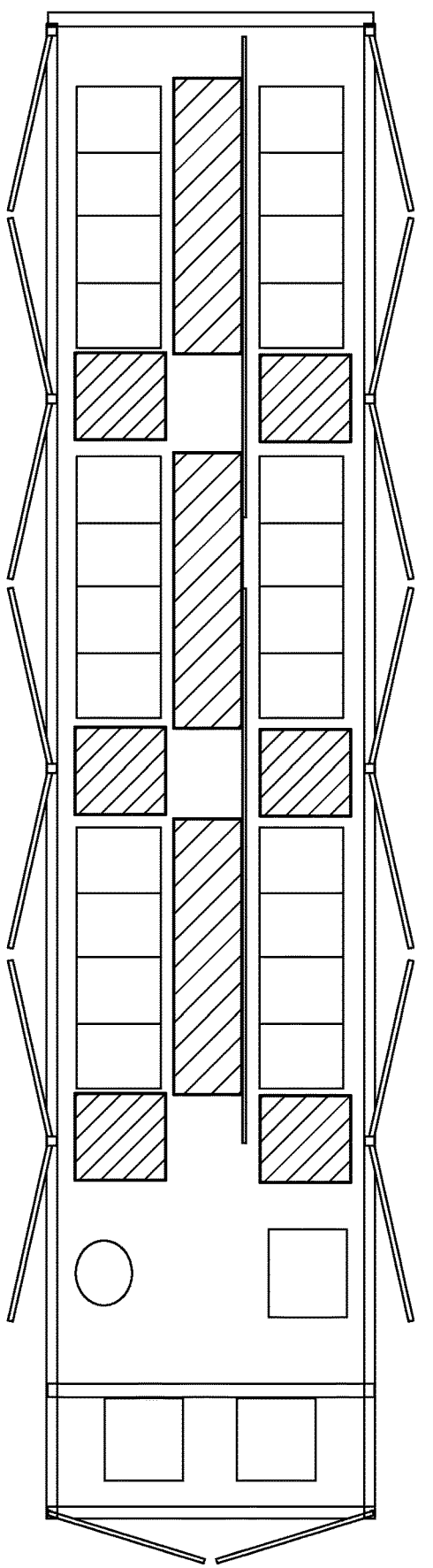
FIG. 5B illustrates a top down view of a layout or room for use with a thermal energy storage and management system.

Referring now to FIGS. 5A-B. FIG. 5A illustrates an example of a layout or room for use with a thermal energy storage and management system and the methods herein. FIG. 5B illustrates a top down view of a layout or room for use with a thermal energy storage and management system and the methods herein. Methods described herein may, in some embodiments, further comprise changing the phase of the second phase change material from a first phase to a second phase by exposing the second phase change material to an ambient temperature of the room above (or below) a phase change temperature of the second phase change material. In FIG. 5A-B an example of a room indicating dimensionality of passive thermal storage batteries, for being placed on racks or stands. Further, the room is disclosed depicting the transfer of ambient air to neighboring environmental structures or rooms. The second phase change material may be subsequently reverted to the first phase by either exposing the second phase change material to an ambient temperature of the room on an opposing side of the first phase change (below the phase transition temperature if previously exposed to a temperature above the phase transition temperature, or vice versa). The reversion to the first phase may be aided by the use of a traditional HVAC system in thermal communication with the room, or may be the result of external environmental temperature changes.

A heat source of the room, either which raises the temperature above the phase transition temperature of the second PCM, or to at/above the first setpoint or second setpoint (as appropriate) may comprise or include a plurality of batteries. The same battery or batteries may provide power to the one or more optional powered components of the active thermal storage battery.

III. Embodiments

Certain implementations of systems and methods consistent with the present disclosure are disclosed in the appendix to the specification, which constitutes the disclosure of the incorporated provisional patent application, and which appendix is incorporated herein by reference. Additional implementations are provided as follows:

Implementation 1. A thermal energy management system comprising: at least one active thermal storage battery; and at least one passive thermal storage battery, wherein the at least one active thermal storage battery comprises: a container; a heat exchanger disposed within the container; and a first phase change material disposed within the container and in thermal contact with the heat exchanger; and wherein the at least one passive thermal storage battery comprises: a plurality of thermal storage cells, individual thermal storage cells comprising: a container having an interior volume; and a second phase change material disposed within the interior volume of the container.

Implementation 2. The system of implementation 1, wherein: the active thermal storage battery has a charging state and a discharging state; while in the charging state, the active thermal storage battery maintains the first phase change material in a first phase or returns the first phase change material to the first phase; and while in the discharging state, the active thermal storage battery transfers thermal energy from an environment external to the first phase change material to the first phase change material by changing the first phase change material to a second phase from the first phase.

Implementation 3. The system of any of the preceding implementations, wherein the active thermal storage battery further comprises at least one powered component.

Implementation 4. The system of implementation 3, wherein the at least one powered component comprises a thermostat.

Implementation 5. The system of implementation 4, wherein: the thermostat initiates a shift from the charging state to the discharging state when a temperature of the environment external to the first phase change material rises above a first setpoint temperature; the environment external to the first phase change material has an operational minimum temperature and an operational maximum temperature; and the first setpoint temperature is greater than or equal to the operational maximum temperature.

Implementation 6. The system of implementation 5, wherein the first setpoint temperature is higher than a phase transition temperature of the first phase change material from the first phase to the second phase.

Implementation 7. The system of implementation 6, wherein the first setpoint temperature is between 5° C. and 50° C. higher than the phase transition temperature of the first phase change material from the first phase to the second phase.

Implementation 8. The system of implementation 7, wherein the first setpoint temperature is between 10° C. and 30° C. higher than the phase transition temperature of the first phase change material from the first phase to the second phase.

Implementation 9. The system of implementation 7, wherein the first setpoint temperature is between 20° C. and 40° C. higher than the phase transition temperature of the first phase change material from the first phase to the second phase.

Implementation 10. The system of implementation 5, wherein the thermostat initiates a shift from the discharging state to the charging state when a temperature of the environment external to the first phase change material drops below the first setpoint temperature.

Implementation 11. The system of implementation 5, wherein: the thermostat initiates a shift from the discharging state to the charging state when a temperature of the environment external to the first phase change material drops below a second setpoint temperature; and the second setpoint temperature is lower than the first setpoint temperature.

Implementation 12. The system of implementation 11, wherein the second setpoint temperature is less than the operational maximum temperature of the environment external to the first phase change material.

Implementation 13. The system of any of the previous implementations 5-12, wherein the operational minimum temperature and operational maximum temperature are set according to performance ranges for electronic equipment disposed in the environment external to the first phase change material.

Implementation 14. The system of implementation 13, wherein the electronic equipment comprises a plurality of batteries.

Implementation 15. The system of any of the implementations 4-14, wherein a phase transition temperature of the second phase change material is between the operational minimum temperature and the operational maximum temperature.

Implementation 16. The system of any of the implementations 4-14, wherein a phase transition temperature of the second phase change material is less than or equal to the operational minimum temperature.

Implementation 17. The system of implementation 16, wherein the phase transition temperature of the second phase change material is within 2° C. to 5° C. less than the operational minimum temperature.

Implementation 18. The system of any of the implementations 4-14, wherein a phase transition temperature of the second phase change material is greater than or equal to the operational maximum temperature.

Implementation 19. The system of implementation 18, wherein the phase transition temperature of the second phase change material is within 2° C. and 5° C. greater than the operational maximum temperature.

Implementation 20. The system of any of the implementations 3-19, wherein the at least one powered component comprises at least one electrical switch configured to initiate a shift from the charging state to the discharging state and configured to initiate a shift from the discharging state to the charging state.

Implementation 21. The system of implementation 20, wherein the electrical switch is configured to detect a power outage and to initiate a shift from the charging state to the discharging state when the power outage is detected.

Implementation 22. The system of implementation 21, wherein the electrical switch is configured to detect restoration of power after the power outage and to initiate a shift from the discharging state to the charging state with the restoration of power is detected.

Implementation 23. The system of any of implementation 3-23, wherein the at least one powered component comprises at least one chiller unit.

Implementation 24. The system of implementation 23, wherein: in the charging state, the chiller unit is operable to maintain the first phase change material in the first phase or to transition the first phase change material from the second change to the first phase.

Implementation 25. The system of any of the implementations 3-24, wherein the at least one powered component comprises at least one fluid pump operable to flow fluid through the heat exchanger in the active thermal storage battery.

Implementation 26. The system of implementation 25, wherein the fluid is water.

Implementation 27. The system of implementation 25, wherein the fluid is glycol.

Implementation 28. The system of any of the implementations 3-27, wherein the at least one powered component comprises at least one fan coil.

Implementation 29. The system of implementation 28, wherein the at least one fan coil is operable to intake air from the environment external to the first phase change material.

Implementation 30. The system of implementation 28 or 29, wherein the at least one fan coil is operable to exhaust air from the active thermal storage battery.

Implementation 31. The system of implementation 30, wherein the exhausted air has a temperature lower than a temperature of the ambient air in the environment external to the first phase change material.

Implementation 32. The system of implementation 31, wherein the exhausted air is at least 10° C. cooler than the temperature of the ambient air in the environment external to the first phase change material.

Implementation 33. The system of implementation 31, wherein the exhausted air is at least 20° C. cooler than the temperature of the ambient air in the environment external to the first phase change material.

Implementation 34. The system of any of implementation 3-33, wherein a latent heat of the first phase change material is higher than a power draw of the at least one powered component over a period of up to 5 hours while in the discharging mode.

Implementation 35. The system of any of implementations 3-33, wherein a latent heat of the first phase change material is higher than a power draw of the at least one powered component over a period of up to 3 hours while in the discharging mode.

Implementation 36. The system of any of the implementations 3-33, wherein the at least one powered component is powered by a traditional energy grid.

Implementation 37. The system of any of the implementations 3-34, wherein the at least one powered component is powered by at least one battery.

Implementation 38. The system of any of the implementations 3-34, wherein the at least one powered component is powered by a traditional energy grid in the charging mode; and the at least one powered component is powered by at least one battery in the discharging mode.

Implementation 38. The system of any of the preceding implementations, wherein the first phase change material has a phase transition temperature within one of the following ranges: 16-23° C.; 16-18° C.; 15-20° C.; 6-8° C.; 0-6° C.; −10° C. to 0° C.; and −40° C. to −10° C.

Implementation 39. The system of implementation 38, wherein the first phase change material has a phase transition temperature within one of the following ranges: 6-8° C.; 0-6° C.; −10° C. to 0° C.; and −40° C. to −10° C.

Implementation 40. The system of implementation 38, wherein the first phase change material has a phase transition temperature within the range of 0–6° C.

Implementation 41. The system of any of the preceding implementations, wherein the second phase change material has a phase transition temperature within one of the following ranges: 16-23° C.; 16-18° C.; 15-20° C.; 20-28° C.; 6-8° C.; and 8-15° C.

Implementation 42. The system of implementation 41, wherein the second phase change material has a phase transition temperature within one of the following ranges: 16-23° C.; 20-28° C.

Implementation 43. The system of implementation 41, wherein the second phase change material has a phase transition temperature within one of the following ranges: 6-8° C.; 0-6° C.; and −10° C. to 0° C.

Implementation 44. A method of managing the temperature of a room, the method comprising: disposing one or more systems of any of the preceding claims in thermal communication with the room, wherein the environment external to the first phase change material is an interior of the room.

Implementation 45. The method of implementation 44 further comprising: initiating the discharging state to maintain a temperature of the room or to reduce a temperature of the room by changing the first phase change material from the first phase to the second phase.

Implementation 46. The method of implementation 45, wherein initiating the discharging state is performed by the thermostat when the temperature of the room meets or exceeds the first setpoint temperature.

Implementation 47. The method of implementation 45, wherein the at least one powered component is powered by the traditional power grid in the charging state and by the at least one battery in the discharging state; and wherein initiating the discharging state is performed by the electronic switch when a power source for the at least one powered component changes from the traditional power grid to the at least one battery.

Implementation 48. The method of any of the implementations 44-47 further comprising: changing the phase of the second phase change material from a first phase to a second phase by exposing the second phase change material to an ambient temperature of the room above a phase change temperature of the second phase change material.

Implementation 49. The method of implementation 48 further comprising reverting the second phase change material to the first phase by cooling the room with an HVAC system of the room.

Implementation 50. The method of implementation 48 further comprising reverting the second phase change material to the first phase by exposing the second phase change material to an ambient temperature of the room below the phase change temperature of the second phase change material.

Implementation 51. The method of any of the implementations 44-47 further comprising: changing the phase of the second phase change material from a first phase to a second phase by exposing the second phase change material to an ambient temperature of the room below a phase change temperature of the second phase change material.

Implementation 51. The method of implementation 51 further comprising reverting the second phase change material to the first phase by heating the room with an HVAC system of the room.

Implementation 52. The method of implementation 51 further comprising reverting the second phase change material to the first phase by exposing the second phase change material to an ambient temperature of the room below the phase change temperature of the second phase change material.

Implementation 53. The method of any of the implementations 44-53, wherein the room contains a plurality of batteries.

Implementation 54. The method of implementation 53, wherein a heat source of the room comprises the plurality of batteries.

Implementation 55. The method of any of the implementations 44-54 comprising initiating the charging state to maintain the first phase change material in the first phase or to revert the phase change material from the second phase to the first phase.

Implementation 56. The method of implementation 55, wherein initiating the charging state is performed by the thermostat when the temperature of the room drops to less than or equal to the first setpoint temperature.

Implementation 57. The method of implementation 55, wherein initiating the charging state is performed by the thermostat when the temperature of the room drops to less than or equal to a second setpoint temperature, the second setpoint temperature being lower than the first setpoint temperature.

Implementation 58. The method of any of the implementations 55-57, wherein:

the at least one powered component is powered by the traditional power grid in the charging state and by the at least one battery in the discharging state; and initiating the charging state is performed by the electronic switch when the power source of the at least one powered component changes from the at least one battery to the traditional power grid.

Implementation 59. The method of implementation 44 wherein a plurality of batteries are disposed in the room; and the room has an operational minimum temperature and an operational maximum temperature, the operational minimum temperature being defined by a temperature associated with a minimum operational capacity of the plurality of batteries and the operational maximum temperature being define by a temperature associated with a maximum operational capacity of the plurality of batteries.

Implementation 60. The method of implementation 59 further comprising initiating the discharging state when the temperature of the room meets or exceeds the operational maximum temperature.

Implementation 61. The method of either of implementations 59 or 60 further comprising initiating the charging state when temperature of the room is less than the operational maximum temperature.

Various implementations of apparatus and methods have been described in fulfillment of the various objectives of the present disclosure. It should be recognized that these implementations are merely illustrative of the principles of the present disclosure. Numerous modifications and adaptations thereof will be readily apparent to those skilled in the art without departing from the spirit and scope of the present disclosure. For example, individual steps of methods described herein can be carried out in any manner and/or in any order not inconsistent with the objectives of the present disclosure, and various configurations or adaptations of apparatus described herein may be used.

The invention claimed is:

1. A thermal energy management system, comprising:
  (a) at least one active thermal storage battery comprising:
    (i) an insulated container defining an interior volume,
    (ii) a first phase change material disposed within the interior volume of the insulated container,
    (iii) a heat exchanger comprising a plurality heat exchange plates disposed within the interior volume of the container in thermal contact with the first phase change material, wherein a fluid flowing through the heat exchanger flows through the heat exchange plates,
    (iv) a fan coil connected in fluid communication with the heat exchanger, and
    (v) a fluid pump operable to flow fluid through and between the heat exchanger and the fan coil; and (b) at least one passive thermal storage battery comprising a plurality of thermal storage cells, each said thermal storage cell comprising:
  (i) a container having an interior volume and
  (ii) a second phase change material disposed within the interior volume of the container without a heat exchanger disposed therein,
  (iii) wherein an exterior surface of the container defines one or more openings for air flow through the container between opposite sides of the container for heat exchange directly between the air flow and the exterior surface of the container.

2. The system of claim 1, wherein the active thermal storage battery has
  (a) a charged state, wherein the first phase change material is maintained in a first phase; and
  (b) a discharged state, wherein the first phase change material has changed to a second phase from the first phase.

3. The system of claim 1, wherein the active thermal storage battery further comprises an electrical switch for initiating charging or discharging of the first phase change material.

4. The system of claim 1, wherein the active thermal storage battery further comprises a thermostat for initiating charging or discharging of the first phase change material.

5. The system of claim 4, wherein the thermostat initiates discharging of the first phase change material when a temperature of the environment external to the first phase change material rises above a first setpoint temperature; wherein the environment external to the first phase change material has an operational minimum temperature and an operational maximum temperature; and wherein the first setpoint temperature is not less than the operational maximum temperature.

6. The system of claim 1, wherein the thermal energy management system further comprises a chiller unit operable to charge the first phase change material of the active thermal storage battery.

7. The system of claim 1, wherein the thermal energy management system further comprises fluid passageways and connectors for connecting the active thermal storage battery in fluid communication with an HVAC chiller for charging of the first phase change material of the active thermal storage battery.

8. The system of claim 5, wherein the thermostat initiates charging when a temperature of the environment external to the first phase change material drops below a second setpoint temperature.

9. The system of claim 5, wherein the first setpoint temperature is between 10° C. and 30° C. higher than the phase transition temperature of the first phase change material from the first phase to the second phase.

10. The system of claim 3, wherein the electrical switch is configured to detect a power outage and to initiate discharging when a power outage is detected.

11. The system of claim 8, wherein the second setpoint temperature is less than the operational maximum temperature of the environment external to the first phase change material.

12. The system of claim 1, wherein the active thermal storage battery further comprises a chiller unit.

13. The system of claim 1, wherein the fan coil and the fluid pump are powered by a traditional energy grid during charging of the first phase change material and is powered by at least one battery during discharging of the first phase change material.

* * * * *